(12) United States Patent
Kawahito et al.

(10) Patent No.: US 8,587,709 B2
(45) Date of Patent: Nov. 19, 2013

(54) HIGH-SPEED CHARGE-TRANSFER PHOTODIODE, A LOCK-IN PIXEL, AND A SOLID-STATE IMAGING DEVICE

(75) Inventors: Shoji Kawahito, Hamamatsu (JP); Hiroaki Takeshita, Hamamatsu (JP)

(73) Assignee: National University Corporation Shizuoka University, Shizuoka-shi (JP)

( * ) Notice: Subject to any disclaimer, the term of this patent is extended or adjusted under 35 U.S.C. 154(b) by 372 days.

(21) Appl. No.: 13/056,816

(22) PCT Filed: Jul. 31, 2009

(86) PCT No.: PCT/JP2009/063676
§ 371 (c)(1),
(2), (4) Date: Mar. 23, 2011

(87) PCT Pub. No.: WO2010/013811
PCT Pub. Date: Feb. 4, 2010

(65) Prior Publication Data
US 2011/0187908 A1 Aug. 4, 2011

(30) Foreign Application Priority Data
Jul. 31, 2008 (JP) ................ P2008-198872

(51) Int. Cl.
*H04N 3/14* (2006.01)
*H04N 5/335* (2011.01)
*C12Q 1/68* (2006.01)
*H01J 40/00* (2006.01)

(52) U.S. Cl.
USPC ............ 348/302; 348/294; 257/239; 250/200

(58) Field of Classification Search
USPC ................. 348/294–324; 250/200; 257/213, 257/215–251
See application file for complete search history.

(56) References Cited

U.S. PATENT DOCUMENTS 4,481,522 A * 11/1984 Jastrzebski et al. ............ 257/229
5,283,426 A * 2/1994 Bowlby et al. ............. 250/208.1
(Continued)

FOREIGN PATENT DOCUMENTS

JP 61-248554 11/1986
JP 5-283666 10/1993
(Continued)

OTHER PUBLICATIONS

Office Action issued on Feb. 5, 2013 in the counterpart Japanese Patent Application No. 2008-198872 (with English Translation).

(Continued)

*Primary Examiner* — Chia-Wei A Chen
(74) *Attorney, Agent, or Firm* — Oblon, Spivak, McClelland, Maier & Neustadt, L.L.P.

(57) ABSTRACT

The present invention provides a high-speed charge-transfer photodiode encompassing a first conductivity type semiconductor layer (20) serving as a charge-generation region; and a second conductivity type surface-buried region (21a) serving as a charge-transfer region of charges generated by the charge-generation region, wherein a specified direction in the surface-buried region (21a) provided along a plane parallel to a surface of the semiconductor layer (20) is assigned as a charge-transfer direction of the charges, and at least one of a variation of widths of the surface-buried region (21a) measured in an orthogonal direction to the charge-transfer direction and a variation of impurity concentration distributions of the surface-buried region (21a), which are measured along the charge-transfer direction, is determined such that an electric field distribution in the charge-transfer direction is constant.

18 Claims, 13 Drawing Sheets

(56) References Cited

U.S. PATENT DOCUMENTS

| | | | |
|---|---|---|---|
| 5,504,526 A * | 4/1996 | Miyagawa et al. | 348/313 |
| 5,903,021 A | 5/1999 | Lee et al. | |
| 6,255,680 B1 | 7/2001 | Nakashiba | |
| 6,433,369 B2 * | 8/2002 | Jung et al. | 257/215 |
| 6,670,990 B1 * | 12/2003 | Kochi et al. | 348/310 |
| 6,906,793 B2 * | 6/2005 | Bamji et al. | 356/141.1 |
| 7,464,351 B2 * | 12/2008 | Bamji et al. | 716/50 |
| 7,518,143 B2 * | 4/2009 | Sugawa | 257/59 |
| 7,652,705 B2 * | 1/2010 | Suzuki | 348/308 |
| 7,923,673 B2 * | 4/2011 | Buttgen et al. | 250/208.1 |
| 8,363,141 B2 * | 1/2013 | Shinohara | 348/308 |
| 2002/0100887 A1 | 8/2002 | Hagiwara et al. | |
| 2002/0153540 A1 * | 10/2002 | Jung et al. | 257/215 |
| 2003/0223053 A1 * | 12/2003 | Liu et al. | 356/5.1 |
| 2005/0206766 A1 * | 9/2005 | Suzuki | 348/308 |
| 2006/0108613 A1 * | 5/2006 | Song et al. | 257/233 |
| 2006/0128087 A1 * | 6/2006 | Bamji et al. | 438/199 |
| 2007/0176213 A1 * | 8/2007 | Oda | 257/247 |
| 2008/0036888 A1 * | 2/2008 | Sugawa et al. | 348/294 |
| 2008/0079833 A1 | 4/2008 | Ichikawa et al. | |

FOREIGN PATENT DOCUMENTS

| | | |
|---|---|---|
| JP | 5-283670 | 10/1993 |
| JP | 5 347401 | 12/1993 |
| JP | 9 289301 | 11/1997 |
| JP | 10 50976 | 2/1998 |
| JP | 10 209422 | 8/1998 |
| JP | 10 508736 | 8/1998 |
| JP | 11 345957 | 12/1999 |
| JP | 2000 236081 | 8/2000 |
| JP | 2002 231926 | 8/2002 |
| JP | 2003 510561 | 3/2003 |
| JP | 2004 104676 | 4/2004 |
| JP | 2008 89346 | 4/2008 |
| JP | 2008 103647 | 5/2008 |
| JP | 2009-21316 | 1/2009 |
| WO | 2007 026777 | 3/2007 |

OTHER PUBLICATIONS

International Preliminary Report on Patentability issued Aug. 11, 2011 in Application No. PCT/JP2009/063676 (English Translation).
International Search Report issued Sep. 8, 2009 in PCT/JP09/063676 filed Jul. 31, 2009.

* cited by examiner

HIGH-SPEED CHARGE-TRANSFER PHOTODIODE, A LOCK-IN PIXEL, AND A SOLID-STATE IMAGING DEVICE

TECHNICAL FIELD

The present invention relates to a high-speed charge-transfer photodiode, a lock-in pixel having the high-speed charge-transfer photodiode, and a solid-state imaging device in which the lock-in pixels are arrayed one-dimensionally or two-dimensionally.

BACKGROUND ART

A sensor element that has a function for modulating, in a time domain, a detection of electrons generated by light in the inside of a pixel, such as "Device and Method for the Detection and Demodulation of an Intensity-modulated Radiation Field (see Patent Document 1)" announced in 1994 or the like, is also referred to as "a lock-in pixel".

If the sensor element encompassing the foregoing lock-in pixels is applied to a buried photodiode structure used in a recent CMOS image sensor so that a lock-in image sensor can be achieved, a sensor that can be manufactured at a low price and can achieve a high performance is expected to be obtained because CMOS image sensor is superior in mass productivity.

For example, a three-dimensional imaging system that includes a two-dimensional array implemented by light-detection detector-pixels, dedicated electronic circuits and corresponding processing circuits, which are merged on a common IC by using a CMOS manufacturing system, is proposed (see Patent Document 2). In one embodiment of Patent Document 1, each detector has a corresponding high speed counter for accumulating the number of clock pulses proportional to a time of flight (TOF), for a pulse which is emitted by the system, reflected from a point of a physical body, and detected by a focused pixel detector. The TOF data gives a direct digital scale with regard to a distance from a particular pixel to a point on the physical body at which the emitted light pulse is reflected. In a second embodiment of Patent Document 2, the counter and the high-speed clock circuit are not provided, and instead of the counter and the high-speed clock circuit, a charge accumulator and an electronic shutter (S1) are provided in each pixel detector. Each pixel detector accumulates charges, and its total amount gives the direct scale of the reciprocating TOF.

RELATED ART DOCUMENT

Patent Document

Patent Document 1: JP-H10 (1998)-508736A
Patent Document 2: JP-2003-510561A

DISCLOSURE OF INVENTION

Technical Problem

In the buried photodiode, a fringing electric field when it is perfectly depleted is used, a surface is covered with a p-type layer, a transit channel of electrons is buried, and the electrons are avoided from being brought into contact with a boundary between silicon (Si) and a silicon oxide film ($SiO_2$). Thus, the electrons can be protected from being captured by the trapping of the boundary. With skillful utilization, the charge transfer of a high speed is expected to be possible. Consequently, the application of many new image sensors such as a range-finding image sensor through the use of the TOF method and the like is expected to be developed.

However, because the structure (shape) of the conventionally and generally-used buried photodiode has a demerit that high speed charge transfer is impossible, application to the range-finding image sensor based upon the TOF method, which must detect the slight delay time of the light in particular, is difficult. The demerit is ascribable to the situation that, in the conventional buried photodiode, even if a high electric field is partially established, a region whose electric field is weak is generated in a part of a transfer path, and a transfer speed is limited by the region of the weak electric field, and the transfer time becomes long.

The present invention is proposed in view of the above circumstances, and an object of the present invention is to provide a high-speed charge-transfer photodiode implemented by a configuration such that a large and constant value of electric field distribution is established in a charge-transfer direction, along a long distance as long as possible, a lock-in pixel having the high-speed charge-transfer photodiode; and a solid-state imaging device (lock-in image sensor) that uses the lock-in pixels as the sensor elements (pixels).

Technical Solution

In order to achieve the above objects, a first aspect of the present invention inheres in a photodiode encompassing a first conductivity type semiconductor layer serving as the charge-generation region; and a second conductivity type surface-buried region selectively buried in a part of an upper portion of this semiconductor layer, serving as a charge-transfer region of charges generated by the charge-generation region. Then, in the photodiode, a specified direction in the surface-buried region provided along a plane parallel to a surface of the semiconductor layer is assigned as a charge-transfer direction of the charges, and at least one of a variation of widths of the surface-buried region defined in an orthogonal direction to the charge-transfer direction and a variation of impurity concentration distributions of the surface-buried region, which are measured along the charge-transfer direction, is determined such that an electric field distribution in the charge-transfer direction is constant.

A second aspect of the present invention inheres in lock-in pixel encompassing a high-speed charge-transfer photodiode configured to receive a pulsed light reflected by a target sample as an optical signal, to convert into signal charges in a charge-generation region, and to inject the signal charges into a charge-transfer region; a charge-collection region connected to the charge-transfer region, implemented by the same semiconductor region as the charge-transfer region; first and second transfer gate electrodes configured to electrostatically control potentials of first and second transfer channels implemented by the same semiconductor region as the charge-collection region through an insulation film formed on the first and second transfer channels, respectively, and to collect the signal charges generated by the charge-generation region into the charge-collection region, and to alternately transfer the signal charges through the first and second transfer channels; and first and second floating-diffusion regions configured to sequentially accumulate the signal charges transferred by the first and second transfer gate electrodes, respectively. And, the high-speed charge-transfer photodiode in the lock-in pixel embraces a first conductivity type semiconductor layer serving as the charge-generation region; and a second conductivity type surface-buried region selectively buried in a part of an upper portion of this semiconductor layer, serving as the charge-transfer region of the charges generated by the charge-generation region. Moreover, in the lock-in pixel, a specified direction in the surface-buried region provided along a plane parallel to a surface of the semiconductor layer is assigned as a charge-transfer direction of the charges, and at least one of a variation of widths of the surface-buried region defined in an orthogonal direction to the charge-transfer direction and a variation of impurity concentration distributions of the surface-buried region, which are measured along the charge-transfer direction, is determined such that an electric field distribution in the charge-transfer direction is constant, and synchronously with the pulsed light, by applying a control-pulse signal sequentially to the first and second transfer gate electrodes so as to operate the first and second transfer gate electrodes, a distance from the target sample is measured, on the basis of an allocation ratio of the charges accumulated in the first and second floating-diffusion regions.

A third aspect of the present invention inheres in a solid-state imaging device, in which a plurality of lock-in pixels are arrayed in a one-dimensional direction, and each of the lock-in pixels encompasses a high-speed charge-transfer photodiode configured to receive a pulsed light reflected by a target sample as an optical signal, to convert into signal charges in a charge-generation region, and to inject the signal charges into a charge-transfer region; a charge-collection region connected to the charge-transfer region, implemented by the same semiconductor region as the charge-transfer region; first and second transfer gate electrodes configured to electro-statically control potentials of first and second transfer channels implemented by the same semiconductor region as the charge-collection region through an insulation film formed on the first and second transfer channels, respectively, and to collect the signal charges generated by the charge-generation region into the charge-collection region, and to alternately transfer the signal charges through the first and second transfer channels; and first and second floating-diffusion regions configured to sequentially accumulate the signal charges transferred by the first and second transfer gate electrodes, respectively. And, the high-speed charge-transfer photodiode included in the lock-in pixel in the solid-state imaging device embraces a first conductivity type semiconductor layer serving as the charge-generation region; and a second conductivity type surface-buried region selectively buried in a part of an upper portion of this semiconductor layer, serving as the charge-transfer region of the charges generated by the charge-generation region. Then, in the solid-state imaging device, a specified direction in the surface-buried region provided along a plane parallel to a surface of the semiconductor layer is assigned as a charge-transfer direction of the charges, and at least one of a variation of widths of the surface-buried region defined in an orthogonal direction to the charge-transfer direction and a variation of impurity concentration distributions of the surface-buried region, which are measured along the charge-transfer direction, is determined such that an electric field distribution in the charge-transfer direction is constant, and synchronously with the pulsed light, by applying a control-pulse signal sequentially to the first and second transfer gate electrodes of all of the lock-in pixels, and in each of the lock-in pixels, a distance from the target sample is measured on the basis of an allocation ratio of the charges accumulated in the first and second floating-diffusion regions.

A fourth aspect of the present invention inheres in a solid-state imaging device, in which a plurality of lock-in pixels are arrayed in a shape of a two-dimensional matrix, and each of the lock-in pixels encompasses a high-speed charge-transfer photodiode configured to receive a pulsed light reflected by a target sample as an optical signal, to convert into signal charges in a charge-generation region, and to inject the signal charges into a charge-transfer region; a charge-collection region connected to the charge-transfer region, implemented by the same semiconductor region as the charge-transfer region; first and second transfer gate electrodes configured to electro-statically control potentials of first and second transfer channels implemented by the same semiconductor region as the charge-collection region through an insulation film formed on the first and second transfer channels, respectively, and to collect the signal charges generated by the charge-generation region into the charge-collection region, and to alternately transfer the signal charges through the first and second transfer channels; and first and second floating-diffusion regions configured to sequentially accumulate the signal charges transferred by the first and second transfer gate electrodes, respectively. And, the high-speed charge-transfer photodiode included in the lock-in pixel in the solid-state imaging device embraces a first conductivity type semiconductor layer serving as the charge-generation region; and a second conductivity type surface-buried region selectively buried in a part of an upper portion of this semiconductor layer, serving as the charge-transfer region of the charges generated by the charge-generation region. And, in the solid-state imaging device, a specified direction in the surface-buried region provided along a plane parallel to a surface of the semiconductor layer is assigned as a charge-transfer direction of the charges, and at least one of a variation of widths of the surface-buried region defined in an orthogonal direction to the charge-transfer direction and a variation of impurity concentration distributions of the surface-buried region, which are measured along the charge-transfer direction, is determined such that an electric field distribution in the charge-transfer direction is constant, and synchronously with the pulsed light, by applying a control-pulse signal sequentially to the first and second transfer gate electrodes of all of the lock-in pixels, in each of the lock-in pixels, a distance from the target sample is measured on the basis of an allocation ratio of the charges accumulated in the first and second floating-diffusion regions, and all of the lock-in pixels are two-dimensionally accessed to get a two-dimensional picture corresponding to the measured distance.

Advantageous Effects

According to the present invention, it is possible to provide a high-speed charge-transfer photodiode implemented by a configuration such that a large and constant value of the electric field distribution is established in the charge-transfer direction, along a long distance as long as possible, a lock-in pixel having the high-speed charge-transfer photodiode; and a solid-state imaging device (lock-in image sensor) that uses the lock-in pixels as the sensor elements (pixels).

DETAILED DESCRIPTION OF THE INVENTION

The first and second embodiments of the present invention will be described below with reference to the drawings. In the illustrations of the following drawings, the same or similar reference numbers are given to the same or similar portions. However, attention should be paid to the fact that, since the drawings are only diagrammatic, the relation between the thickness and the flat surface dimension, and the ratio between the thicknesses of respective layers, and the like differ from the actual members. Thus, the specific thicknesses and dimensions should be judged by referring to the following descriptions. Also, of course, the portions in which the mutual dimensional relations and ratios are different are included even between the mutual drawings.

Also, the following first and second embodiments only exemplify the apparatus and method that embody the technical idea of the present invention. Then, although a TOF range-finding image sensor is described as an exemplification, the high-speed charge-transfer photodiode of the present invention can be applied to the various solid-state imaging devices, such as a bio imaging solid-state imaging device for measuring fluorescence from a dyed living cell and fluorescence life, or a temporal correlation image sensor for carrying out various measurements and the like, in addition to the TOF range-finding image sensor. Also, in the technical idea of the present invention, the materials, shapes, structures, arrangements and the like of the configuration parts are not limited to the following items. Various modifications can be applied to the technical idea of the present invention, within the technical scope described in claims.

First Embodiment

Figure 1:
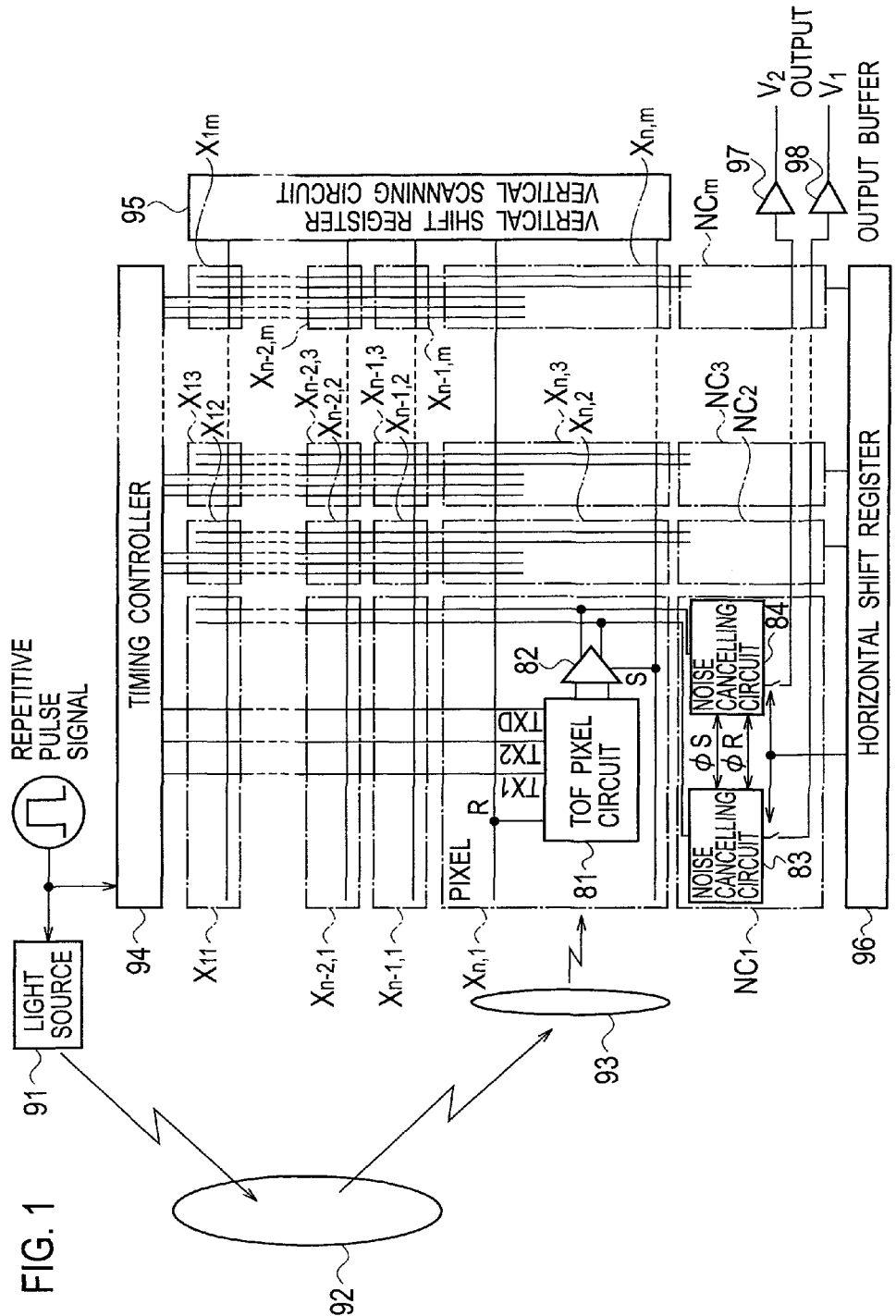
FIG. 1 is a schematic plan view describing a layout on a semiconductor chip of a solid-state imaging device (two-dimensional lock-in image sensor) according to a first embodiment of the present invention.

In a solid-state imaging device (two-dimensional lock-in image sensor) pertaining to a first embodiment of the present invention, as shown in FIG. 1, pixel array areas ($X_{11}$ to $X_{1m}$; $X_{21}$ to $X_{2m}$; - - - ; $X_{n1}$ to $X_{nm}$) and peripheral circuit areas (94, 95, 96, and $NC_1$ to $NC_m$) are integrated on the same semiconductor chip. In the pixel array area, a unit pixel (lock-in pixel) $X_{ij}$ (i=1 to n; j=1 to m: where m, n are integers, respectively) which includes a large number of high-speed charge-transfer photodiodes in a shape of a two-dimensional matrix is arrayed, and, for example, a substantially rectangular imaging area is configured. Then, on the upper side of this pixel array area, the timing control circuit 94 is provided, and on the lower side, a horizontal shift register 96 is provided, along pixel rows $X_{11}$ to $X_{1m}$; $X_{21}$ to $X_{2m}$; - - - ; $X_{n1}$ to $X_{nm}$ directions, respectively. On the left side of the pixel array area, a vertical shift register and vertical scanning circuit 95 is provided along pixel columns $X_{11}$ to $X_{n1}$; $X_{12}$ to $X_{n2}$; - - - ; $X_{1j}$ to $X_{nj}$; $X_{1m}$ to $X_{nm}$ directions.

While an inner structure is exemplified in the unit pixel (lock-in pixel) $X_{n1}$ in FIG. 1, each unit pixel (lock-in pixel) $X_{ij}$ is provided with a TOF pixel circuit 81, which includes the high-speed charge-transfer photodiode (PD), a charge voltage conversion circuit, an integrator, and a voltage control pulse delay circuit, and a voltage reading buffer amplifier 82. By the timing control circuit 94, the horizontal shift register 96 and the vertical shift register and vertical scanning circuit 95, the unit pixel $X_{ij}$ inside the pixel array area is sequentially scanned, and a pixel signal is read out, and an electron shutter operation is executed. That is, the solid-state imaging device pertaining to the first embodiment of the present invention is configured such that, since the pixel array area is vertically scanned at the respective pixel rows $X_{11}$ to $X_{1m}$; $X_{21}$ to $X_{2m}$; - - -; $X_{n1}$ to $X_{nm}$ units, as for the pixel signal of each of the pixel rows $X_{11}$ to $X_{1m}$; $X_{21}$ to $X_{2m}$; - - -; $X_{n1}$ to $X_{nm}$, the pixel signal is read out by the vertical signal line laid for each of the pixel columns $X_{11}$ to $X_{n1}$; $X_{12}$ to $X_{n2}$; - - -; $X_{1j}$ to $X_{nj}$; - - -; $X_{1m}$ to $X_{nm}$.

The signal reading from each of the unit pixels $X_{11}$ to $X_{1m}$; $X_{21}$ to $X_{2m}$; - - -; $X_{n1}$ to $X_{nm}$ is substantially similar to a usual CMOS image sensor. However, control signals TX1 ($\phi$1), TX2 ($\phi$2) for transferring charges from the respective high-speed charge-transfer photodiodes in the respective unit pixels $X_{11}$ to $X_{1m}$; $X_{21}$ to $X_{2m}$; - - -; $X_{n1}$ to $X_{nm}$ are given from the timing control circuit 94 to all of the pixels $X_{11}$ to $X_{1m}$; $X_{21}$ to $X_{2m}$; - - -; $X_{n1}$ to $X_{nm}$ at the same time. Moreover, they are the signals of high frequencies. Thus, switching noise is generated in that period. Hence, the signal reading from the pixel area is carried out by providing a reading period after the completion of the processes executed by noise-cancel processing circuits $NC_1$ to $NC_m$.

Figure 2:
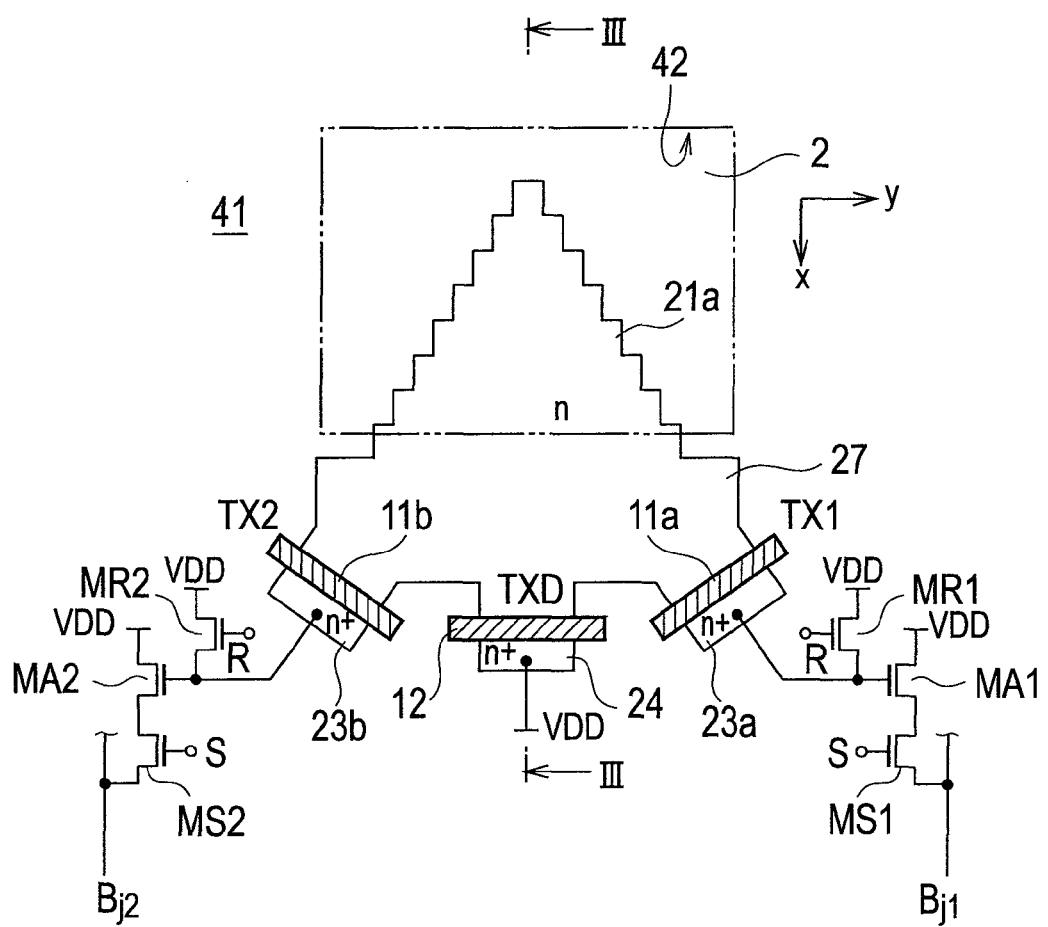
FIG. 2 is a schematically plan view describing a configuration of a pixel (lock-in pixel) of the solid-state imaging device according to the first embodiment of the present invention.
Figure 3:
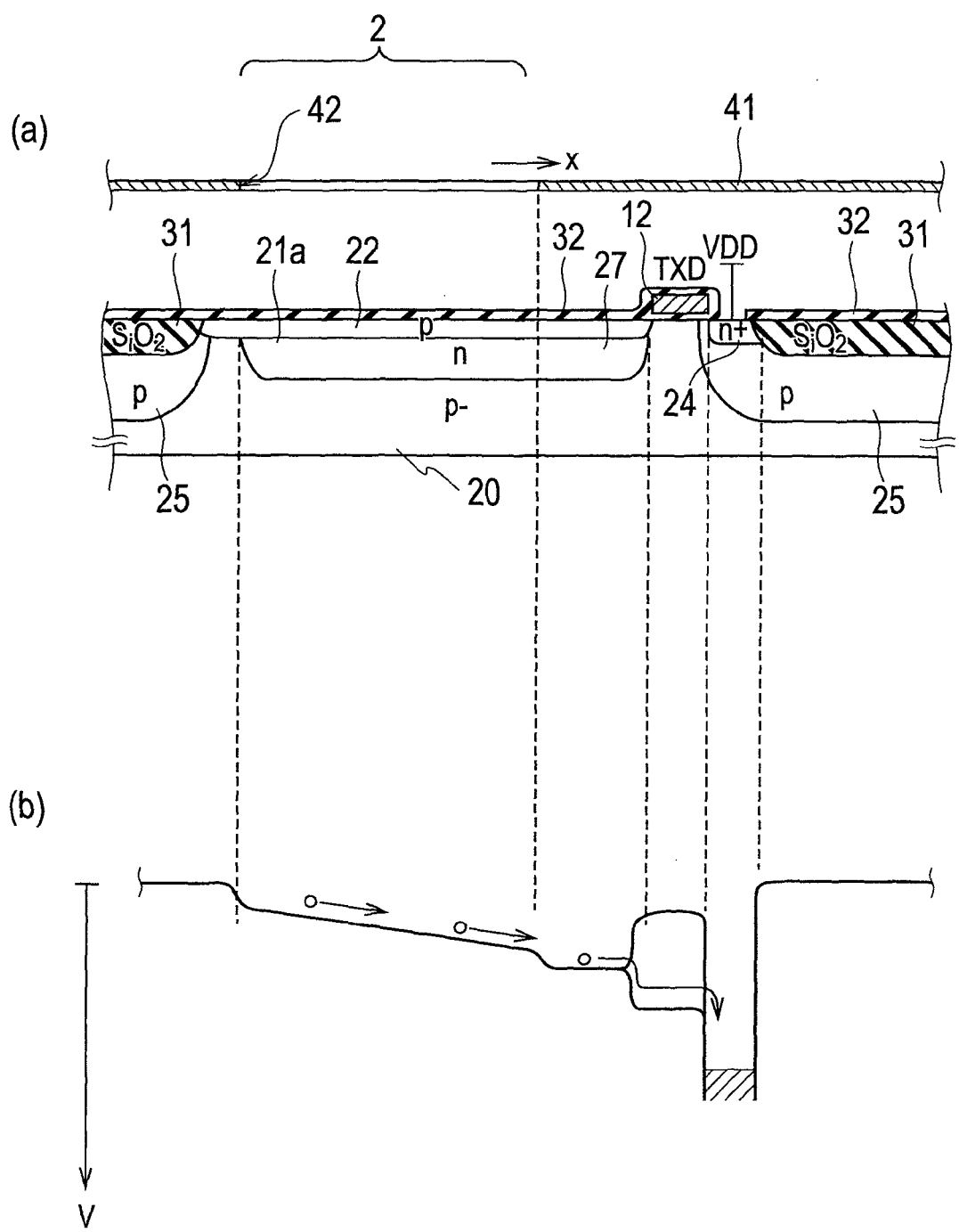
FIG. 3 (a) is a schematic cross-sectional view when viewed from III-III direction in FIG. 2, and FIG. 3 (b) is a potential diagram corresponding 2D to FIG. 3 (a).

FIGS. 2 and 3 (a) show one example of a plan view that describes a physical structure of the TOF pixel circuit 81 inside each of the pixels (lock-in pixels) $X_{11}$ to $X_{1m}$; $X_{21}$ to $X_{2m}$; - - -; $X_{n1}$ to $X_{nm}$ in the solid-state imaging device (TOF range-finding image sensor) pertaining to the first embodiment. As shown in FIGS. 2 and 3 (a), the lock-in pixel pertaining to the first embodiment encompasses a high-speed charge-transfer photodiode 2 that receives a pulsed light reflected by a target sample as an optical signal, and converts into signal charges in a charge-generation region, and then injects the signal charges into a charge-transfer region; a charge-collection region 27 that is connected to the charge-transfer region, implemented by the same semiconductor region as the charge-transfer region; a first transfer gate electrode 11a and a second transfer gate electrode 11b that electro-statically control potentials of first and second transfer channels implemented by the same semiconductor region as the charge-collection region 27 through an insulation film formed on the first and second transfer channels, respectively, and collect signal charges generated by the charge-transfer region into the charge-collection region 27 and then alternately transfer the signal charges through the first and second transfer channels; and a first floating-diffusion region 23a and a second floating-diffusion region 23b that sequentially accumulate the signal charges transferred by the first transfer gate electrode 11a and the second transfer gate electrode 11b, respectively.

In the lock-in pixel pertaining to the first embodiment, an n-type surface-buried region (second conductivity type surface-buried region) 21a serves as the charge-transfer region. However, a first conductivity type semiconductor layer 20 located not only just under the n-type surface-buried region (second conductivity type surface-buried region) 21a but also just under an opening (aperture) 42 of a light shielding film 41 serves as the charge-generation region of the high-speed charge-transfer photodiode 2 pertaining to the first embodiment. Thus, in FIG. 2, the region just under the opening (aperture) 42 is defined as the high-speed charge-transfer photodiode 2. In the high-speed charge-transfer photodiode 2, carriers (electrons) generated in the charge-generation region are injected into a part of the surface-buried region 21a just above the charge-generation region.

In the lock-in pixel pertaining to the first embodiment, a width of the n-type surface-buried region 21a is gradually enlarged toward a transfer direction (x-direction), just under the opening (aperture) 42 in the light shielding film 41 shown on the center in FIG. 2. In FIG. 2, the charge-collection region 27 implemented by the same semiconductor region as the n-type surface-buried region 21a serving as the charge-transfer region is formed on the lower side of the opening (aperture) 42 in the light shielding film 41. Then, on both sides of the lower side of this charge-collection region 27, the first transfer gate electrode 11a and the second transfer gate electrode 11b, which collect the signal charges generated by the high-speed charge-transfer photodiode 2 into the charge-collection region 27 and then alternately transfer them, are arranged while being obliquely branched. When the width of the n-type surface-buried region 21a is made narrow, a potential well is made shallow. So, in the high-speed charge-transfer photodiode 2 pertaining to the first embodiment, when the width of the n-type surface-buried region 21a is widen gradually and stepwise, toward the charge-transfer direction (x-direction) as shown in FIG. 2, an electric field is established in a direction in which the electrons are accelerated toward the charge-transfer direction (x-direction). Thus, the planar configuration shown in FIG. 2 is used so that an electric field distribution in the charge-transfer direction can have a large and constant value along a long distance as long as possible.

The light, which is emitted as a repetitive control-pulse signal from a light source 91 in FIG. 1, is reflected by a target sample 92 and entered through the opening (aperture) 42 in the light shielding film 41 in FIG. 2 to the high-speed charge-transfer photodiode 2. That is, the high-speed charge-transfer photodiode 2 receives the pulsed light, which is entered through the opening (aperture) 42 in the light shielding film 41, as the optical signal, and converts this optical signal into the signal charges.

Moreover, as shown in FIG. 2, the first floating-diffusion region 23a for accumulating the signal charges transferred by the first transfer gate electrode 11a is arranged on the right lower side, and the second floating-diffusion region 23b for accumulating the signal charges transferred by the second transfer gate electrode 11b is arranged on the left lower side. Moreover, on the right lower side in FIG. 2, adjacently to the first floating-diffusion region 23a, a first reset gate electrode (whose illustration is omitted) and a first reset source region (whose illustration is omitted) opposite to the first floating-diffusion region 23a through this first reset gate electrode are arranged along a right downward oblique direction. On the other hand, on the left lower side of FIG. 2, adjacently to the second floating-diffusion region 23b, a second reset gate electrode (whose illustration is omitted) and a second reset source region (whose illustration is omitted) opposite to the second floating-diffusion region 23b through this second reset gate electrode are arranged along a left downward oblique direction. MOS transistors serving as first reset transistors are formed in the first floating-diffusion region 23a, the first reset gate electrode and the first reset source electrode, and MOS transistors serving as second reset transistors are formed in the second floating-diffusion region 23b, the second reset gate electrode and the second reset source region. For the respective first reset gate electrodes and second reset gate electrodes, all of control signals R are set to a high (H) level, and the charges accumulated in the first floating-diffusion region 23a and the second floating-diffusion region 23b are discharged to the first reset source region and the second reset source region, respectively, and the first floating-diffusion region 23a and the second floating-diffusion region 23b are reset.

As shown in FIG. 2, in the lock-in pixel pertaining to the first embodiment, in such a way that, after the signal charges generated by the high-speed charge-transfer photodiode 2 are collected into the charge-collection region 27, the signal charges are transferred to the branch directions different from each other (the right downward oblique direction and the left downward oblique direction), on a planar pattern, each of the first transfer gate electrode 11a and the second transfer gate electrode 11b is arranged such that each of the orthogonal directions to the two transfer directions (the right downward oblique direction and the left downward oblique direction) in FIG. 2 are respectively assigned as the longitudinal directions (gate-width directions).

Moreover, as shown in FIG. 2, on the planar pattern, below the charge-collection region 27, an exhausting gate electrode 12 is arranged on a central line in a vertical direction (upward and downward direction) in FIG. 2, with the horizontal direction as the longitudinal direction (gate-width direction). The exhausting gate electrode 12 collects background-light charges, which are generated in the charge-generation region by background light, into the charge-collection region 27 and then extracts the background-light charges to the downward direction in FIG. 2. The background-light charges extracted by the exhausting gate electrode 12 are received in an extracting drain region 24 provided in the lower direction in FIG. 2.

FIG. 3 (a) shows a cross-sectional configuration viewed from direction of the lock-in pixel shown in FIG. 2. Then, the high-speed charge-transfer photodiode 2 shown just under the opening (aperture) 42 in the light shielding film 41 on the center in FIG. 2 includes the n-type surface-buried region (second conductivity type surface-buried region) 21a serving as a cathode region (second main electrode region) provided on the upper portion of the p-type semiconductor substrate (first conductivity type semiconductor layer) 20 that serves as this anode region (first main electrode region), in which the p-type semiconductor substrate (first conductivity type semiconductor layer) 20 serves as the anode region (first main electrode region). In addition, in the descriptions of the first and second embodiments in the Specification, the first and second embodiments are exemplarily described under assumption that the first conductivity type is assigned as the p-type and the second conductivity type is assigned as the n-type. However, even under assumption that the first conductivity type is assigned as the n-type and the second conductivity type is assigned as the p-type, when the electrical polarities are reversed, the similar effectiveness is obtained. In that case, the reason why the first main electrode region of the n-type serves as the cathode region and the second main electrode region of the p-type serves as the anode region may not be required to be explained. In the upper portion of this n-type surface-buried region (second conductivity type surface-buried region) 21a, a p-type pinning layer (first conductivity type pinning layer) 22 is arranged.

The p-type semiconductor substrate (first conductivity type semiconductor layer) 20 implementing the high-speed charge-transfer photodiode 2 serves as the charge-generation region. Thus, an impurity concentration is preferred to be about $6\times10^{11}$ cm$^{-3}$ or more and about $2\times10^{15}$ cm$^{-3}$ or less. In addition, instead of the p-type semiconductor substrate 20, a structure in which a silicon epitaxial growth layer whose impurity concentration is about $6\times10^{11}$ cm$^{-3}$ or more and about $2\times10^{15}$ cm$^{-3}$ or less is formed on a silicon substrate whose impurity concentration is about $4\times10^{17}$ cm$^{-3}$ or more and about $1\times10^{21}$ cm$^{-3}$ or less is employed, and the silicon epitaxial growth layer may be used as the first conductivity type semiconductor region serving as the charge-generation region. From an industrial meaning, when the silicon epitaxial growth layer whose impurity concentration is about $6\times10^{13}$ cm$^{-3}$ or more and about $1.5\times10^{15}$ cm$^{-3}$ or less is formed on the silicon substrate whose impurity concentration is about $8\times10^{17}$ cm$^{-3}$ or more and about $1\times10^{20}$ cm$^{-3}$ or less and then the silicon epitaxial growth layer is used as the first conductivity type semiconductor region, the silicon epitaxial growth layer is preferable because the silicon epitaxial growth layer can be easily available from the commercial market. The n-type surface-buried region (second conductivity type surface-buried region) 21a is the n-type semiconductor region of a relatively low concentration in which the impurity concentration is about $2\times10^{15}$ cm$^{-3}$ to $6\times10^{17}$ cm$^{-3}$. More preferably, the n-type surface-buried region (second conductivity type surface-buried region) 21a can employ the value in which the impurity concentration is about $5\times10^{16}$ cm$^{-3}$ or more and about $5\times10^{17}$ cm$^{-3}$ or less, typically, for example, about $4\times10^{16}$ cm$^{-3}$. Its thickness can be about 0.1 to 3 μm, preferably, about 0.2 to 0.5 μm. The p-type pinning layer (first conductivity type pinning layer) 22 has a relatively high concentration in which an impurity concentration is about $3\times10^{17}$ cm$^{-3}$ and more and $1.5\times10^{20}$ cm$^{-3}$ or less, and its thickness may be about 20 nm to 1.0 m, preferably, about 50 nm to 300 nm.

A gate insulation film 32 shown in FIG. 3 (a) extends to below the first transfer gate electrode 11a and the second transfer gate electrode 11b that are located on the left and right sides of the lower portion of the opening (aperture) 42 in the light shielding film 41 in FIG. 2, although the illustration is omitted in FIG. 3 (a). FIG. 3 (a) shows a situation in which the gate insulation film 32 extends from just under the opening (aperture) 42 in the light shielding film 41 to below the exhausting gate electrode 12 in the right direction in FIG. 3 (a) (corresponds to the downward direction of FIG. 2). As shown in FIG. 3 (a), below the gate insulation film 32, the surface-buried region 21a is arranged so as to extend in the left and right directions from just under the opening (aperture) 42 in the light shielding film 41 to just under the left end of the exhausting gate electrode 12. That is, in a part of the first conductivity type semiconductor layer 20 that is adjacently located on the further right side of the charge-collection region 27 on the right side of the surface-buried region 21a just under the aperture 42 (just above the charge-generation region), a portion located just under the exhausting gate electrode 12 serves as the exhausting channel. Then, the exhausting gate electrode 12 electrostatically controls a potential of the exhausting channel through the gate insulation films 32 formed on the upper portion of this exhausting channel, respectively, and transfers the background-light charges through the exhausting channel to the extracting drain region 24 of the second conductivity type (n-type). The extracting drain region 24 is the semiconductor region of the impurity concentration higher than the surface-buried region 21a.

Although the illustration is omitted in FIG. 3 (a), as can be understood from the plan view of FIG. 2, below the gate insulation film 32, the surface-buried region 21a extends from just under the opening (aperture) 42 to just under the ends of the first transfer gate electrode 11a and the second transfer gate electrode 11b. That is, in FIG. 2, in a part of the first conductivity type semiconductor layer 20 adjacent to the right lower side of the surface-buried region 21a just under the aperture 42 (just above the charge-generation region), a portion located just under the first transfer gate electrode 11a serves as a first transfer channel. On the other hand, in another part of the first conductivity type semiconductor layer 20 adjacent to the left lower side of the surface-buried region 21a just under the aperture 42 (just above the charge-generation region), a portion located just under the second transfer gate electrode 11b serves as a second transfer channel. Then, the first transfer gate electrode 11a and the second transfer gate electrode 11b electro-statically control the potentials of the first and second transfer channels through the gate insulation films 32 formed on the upper portions of these first and second transfer channels, respectively, and alternately transfer the signal charges through the first and second transfer channels to the first floating-diffusion region 23a and the second floating-diffusion region 23b of the second conductivity type (n-type), respectively. The first floating-diffusion region 23a and the second floating-diffusion region 23b are the semiconductor regions of the impurity concentrations higher than the surface-buried region 21a, respectively.

As shown in FIG. 2, a gate electrode of a signal reading transistor (amplifying transistor) MA1 implementing the voltage reading buffer amplifier 82 shown in FIG. 1 is connected to the first floating-diffusion region 23a, and a gate electrode of a signal reading transistor (amplifying transistor) MA2 in the voltage reading buffer amplifier 82 is connected to the second floating-diffusion region 23b. A source electrode of the signal reading transistor (amplifying transistor) MA1 is connected to a power source VDD, and a drain electrode is connected to a source electrode of a pixel selecting switching transistor MS1. A drain electrode of the pixel selecting switching transistor MS1 is connected to a vertical signal line of a j-th column, and a control signal S for selecting a horizontal line is given to the gate electrode from the vertical shift register and vertical scanning circuit 95. A source electrode of the signal reading transistor (amplifying transistor) MA2 is connected to the power source VDD, and a drain electrode is connected to a source electrode of a pixel selecting switching transistor MS2. A drain electrode of the pixel selecting switching transistor MS2 is connected to a vertical signal line $B_{j2}$ of the j-th column, and the control signal S for selecting the horizontal line is given to the gate electrode from the vertical shift register and vertical scanning circuit 95. When the selecting control signal S is set to a high "H" level, the switching transistors MS1, MS2 are turned on, and currents corresponding to the potentials of the first floating-diffusion region 23a and the second floating-diffusion region 23b that are amplified by the signal reading transistors (amplifying transistors) MA1, MA2 flow through the vertical signal lines $B_{j1}$, $B_{j2}$ of the j-th column.

FIG. 3 (a) shows an example in which as a field insulation film 31 between the gate insulation film 32 and a well 25, a buried insulation film (buried oxide film) of a shallow trench isolation (STI) structure that is used for an element separation in a hyperfine integrated circuit is used. However, as the field insulation film 31, it is possible to use different insulation films, such as a field oxide film formed by a selection oxide method referred to as a LOCOS (Local oxidation of silicon) method used for the element separation, and the like.

When the field insulation film 31 and the gate insulation film 32 are formed by a thermal oxide film, a thickness of the thermal oxide film may be about 150 nm or more and about 1000 nm or less, preferably, about 200 nm or more and about 400 nm or less. When the gate insulation film 32 is formed by a dielectric film other than the thermal oxide film, the thickness of the gate insulation film 32 may be an equivalent thickness that is converted on the basis of a dielectric constant $\in_r$ of the thermal oxide film ($\in_r$=3.8, at 1 MHz). For example, when a CVD oxide film having a dielectric constant of $\in_r$=4.4 is used, a thickness in which the above thickness is multiplied by 4.4/3.8=1.16 may be used, and when a silicon nitride ($Si_3N_4$) film having a dielectric constant of $\in_r$=7 is used, a thickness in which the above thickness is multiplied by 7/3.8=1.84 may be used. However, it is preferable to use the oxide film ($SiO_2$ film) formed by the standard CMOS technique. The use of the field oxide film in the CMOS technique is suitable for simplifying the manufacturing process.

Figure 11:
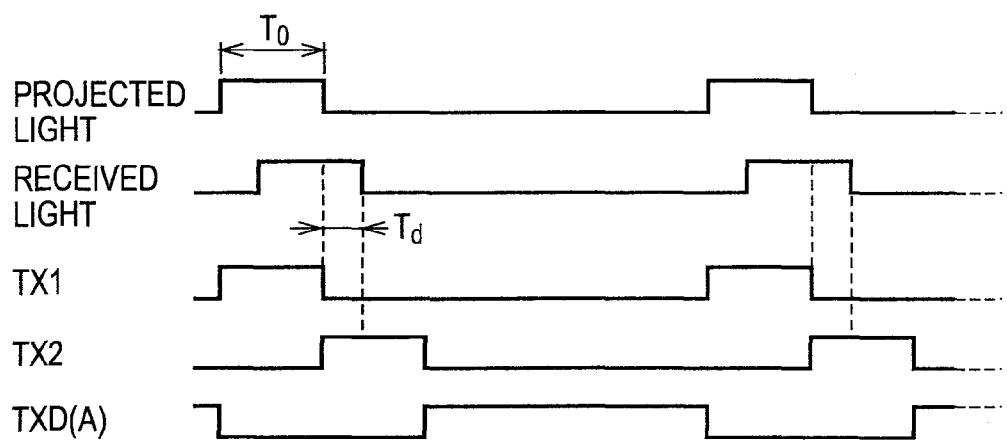
FIG. 11 is a timing chart that describes a relation of an operational timing between a pulsed light entered to a light receiving gate electrode of the lock-in pixel according to the first embodiment and control-pulse signals applied to a first transfer gate electrode, a second transfer gate electrode and an exhausting gate electrode.

Control-pulse signals TX1, TX2 exemplified in FIG. 11 are given to the first transfer gate electrode 11a and the second transfer gate electrode 11b that are formed on the gate insulation film 32. For example, when the control-pulse signal TX1=1V is given to the first transfer gate electrode 11a and the control-pulse signal TX2=−2V is given to the second transfer gate electrode 11b, a potential barrier for the electrons inside the charge-collection region 27 is decreased, and the electrons generated by the light are transferred to the first floating-diffusion region 23a on the right lower side. Reversely, when the control-pulse signal TX1=−2V is given to the first transfer gate electrode 11a and the control-pulse signal TX2=1V is given to the second transfer gate electrode 11b, the electrons generated by the light is transferred to the second floating-diffusion region 23b on the left lower side.

FIG. 3 (b) shows a potential diagram of a depletion potential $V_p$ corresponding to the cross-sectional configuration of the high-speed charge-transfer photodiode 2 pertaining to the first embodiment shown in FIG. 3 (a). In FIG. 2, when the width of the n-type surface-buried region (second conductivity type surface-buried region) 21a measured along a y-direction is made narrow, a depth of a potential well of the depletion potential $V_p$ shown in FIG. 3 (b) is made shallow, and the depth of a potential well is finally connected to the charge-collection region 27 shown at a constant potential. For this reason, as shown in FIG. 3 (b), when along the charge-transfer direction (x-direction) of the charges, the width of the n-type surface-buried region (second conductivity type surface-buried region) 21a (the width of the y-direction) is gradually widen in a staircase style, in the high-speed charge-transfer photodiode 2 pertaining to the first embodiment, the depletion potential $V_p$ with respect to the x-direction becomes gradually higher, as the depth of a potential well approaches the charge-collection region 27 in the right direction. Consequently, in the high-speed charge-transfer photodiode 2 pertaining to the first embodiment, the electric field that is great in the x-direction toward the charge-collection region 27 is generated in a wide range.

Figure 4:
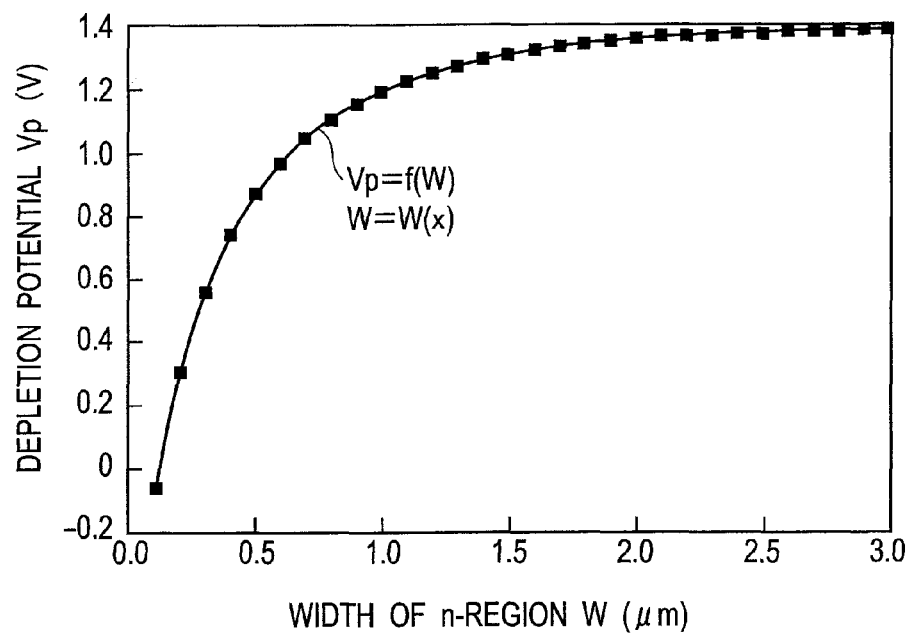
FIG. 4 is a view that shows a relation between a depletion potential $V_p$ of an n-type surface-buried region and a width W=W(x) of the n-type surface-buried region, in a high-speed charge-transfer photodiode according to the first embodiment of the present invention.

In all of the regions on the transfer route along the x-direction of the high-speed charge-transfer photodiode 2 pertaining to the first embodiment, in order to make its electric field constant, the following mechanism may be executed. FIG. 4 shows a result when a relation is determined between the width of the n-type surface-buried region (second conductivity type surface-buried region) 21a in the high-speed charge-transfer photodiode 2 and the potential well. In FIG. 4, a relation between the depletion potential $V_p$ and a width W=W (x) of the n-type surface-buried region (second conductivity type surface-buried region) 21a is assumed as follows.

$$V_p = f(W) \tag{1}$$

When the electric field to the charge-transfer direction (x-direction) is desired to be made constant, the following relation may be established.

$$X = kV_p \tag{2}$$

Here, the k is a constant. Also, an electric field E is represented by the following equation.

$$E = -(dV_p/dX) \quad (3)$$

If, Eq. (2) is established, the following equation is also established.

$$E = -1/k \quad (4)$$

In short, in order to change the depletion potential $V_p$ along the x-direction (the charge-transfer direction of the charges) as shown in FIG. 3 (b), the flat surface shape of the n-type surface-buried region (second conductivity type surface-buried region) 21a may have the shape that depends on the x-direction in which the width W=W(x) measured in the Y-direction (the direction orthogonal to the charge-transfer direction of the charges) is gradually widen along the x-direction as shown in the plan view of FIG. 2.

Figure 5:
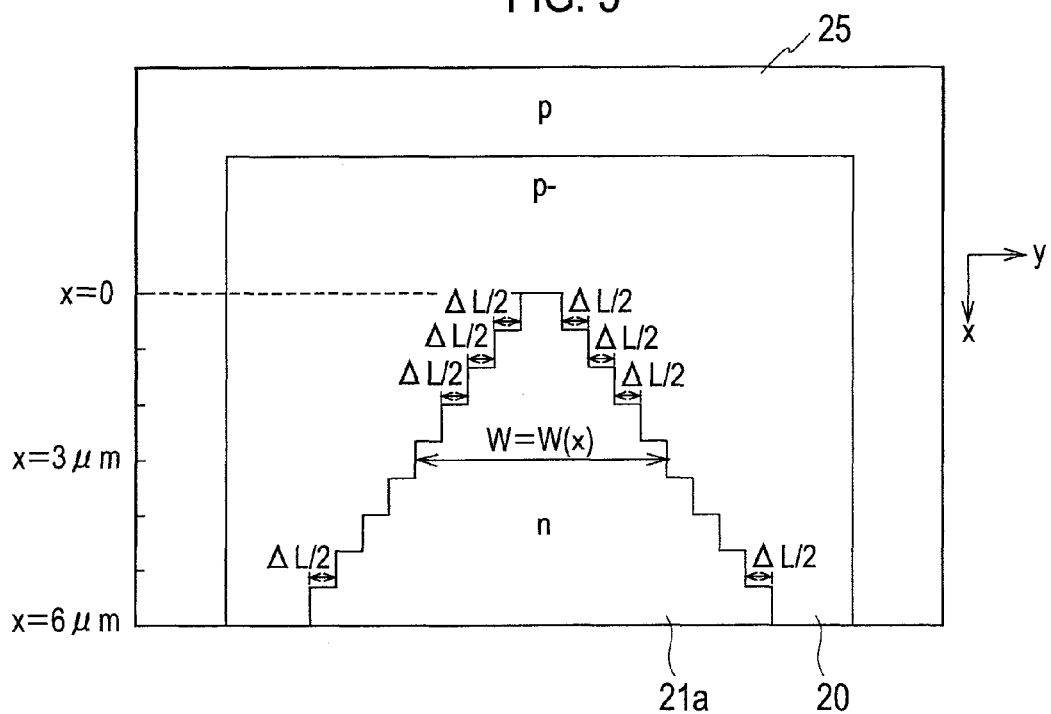
FIG. 5 is a schematic view describing a shape of a planar pattern in which in the high-speed charge-transfer photodiode according to the first embodiment of the present invention, the width W=W(x) of the n-type surface-buried region is changed respectively under a constant ratio ΔL=1.4 μm, 3.0 μm and 4.0 μm, between x=0 μm and x=6 μm in the charge-transfer direction.
Figure 6:
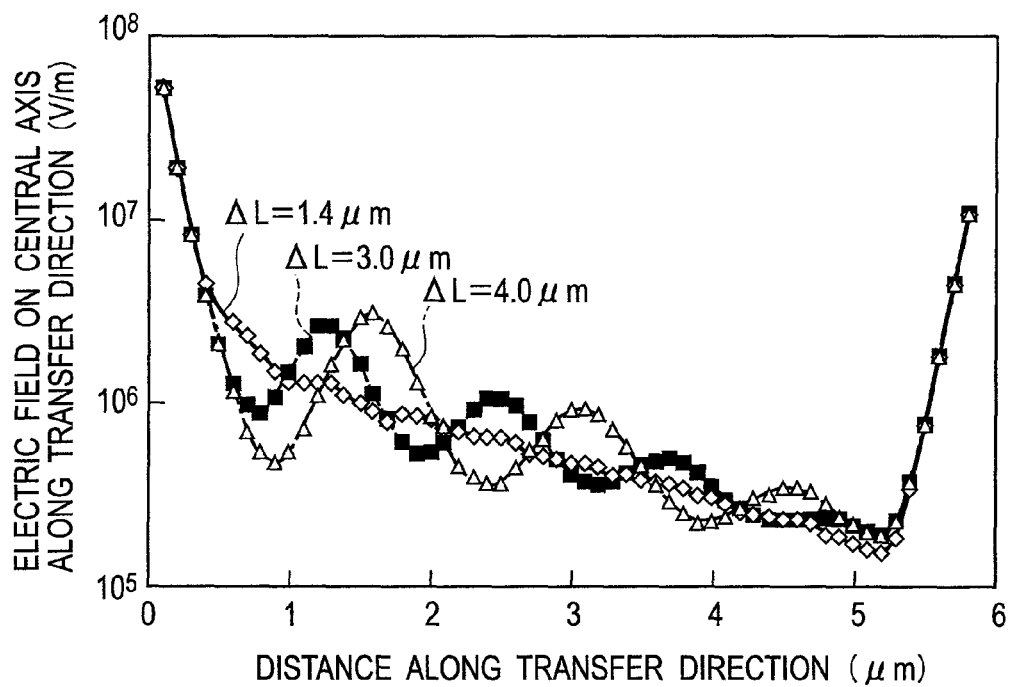
FIG. 6 is a view that shows a relation between an electric field distribution on a central axis of the n-type surface-buried region along a transfer direction and a generation position of electrons along the charge-transfer direction, in the case of the flat surface shape of the n-type surface-buried region shown in FIG. 5.
Figure 7:
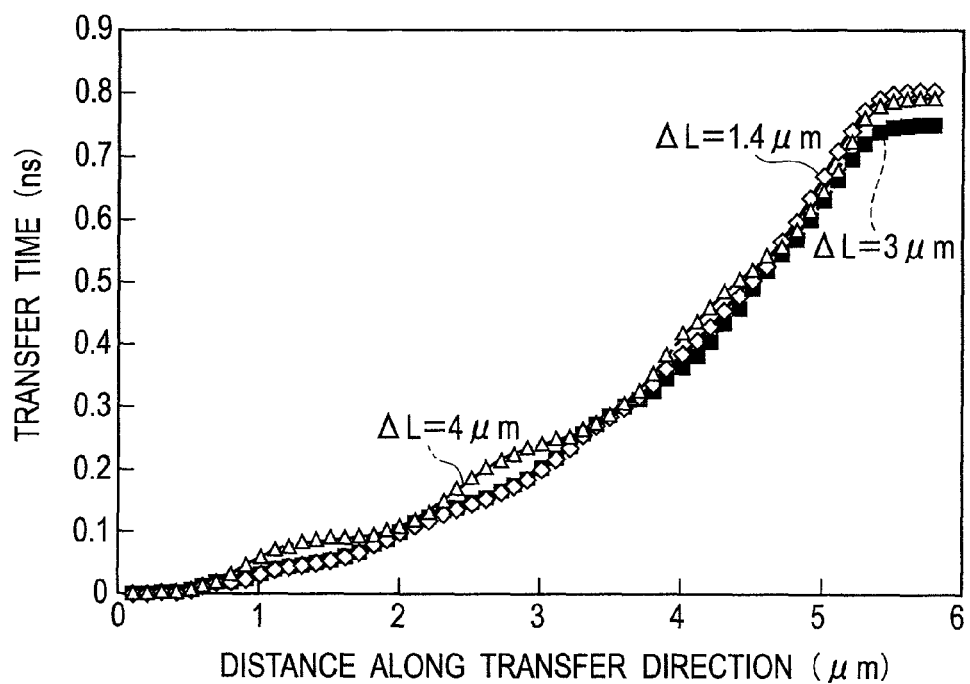
FIG. 7 is a view that shows a relation between the generation position of the electrons along the charge-transfer direction and a time required to transfer the electrons, in the case of the flat surface shape of the n-type surface-buried region shown in FIG. 5.

FIG. 5 shows the shape of the planar pattern of the high-speed charge-transfer photodiode 2 in which between x=0 μm of the charge-transfer direction and x=6 μm serving as the end of the charge-collection region 27, the width W=W(x) of the n-type surface-buried region (second conductivity type surface-buried region) 21a is changed at each of a constant ratio of ΔL=1.4 μm, 3.0 μm and 4.0 μm. FIG. 6 shows a relation between the electric field distribution on the central axis of the n-type surface-buried region (second conductivity type surface-buried region) 21a along the charge-transfer direction and the generation position of the electrons along the charge-transfer direction, in the case of the flat surface shape shown in FIG. 5. FIG. 7 shows a relation between the generation position of the electrons along the charge-transfer direction and the time required to transfer the electrons. From FIG. 7, between x=0 μm and x=6 μm of the charge-transfer direction, the transfer time is 1 ns or less. Thus, this is known to be the sufficiently high speed. However, when the width W=W(x) of the n-type surface-buried region (second conductivity type surface-buried region) 21a is changed at the ratio ΔL=1.4 μm, 3.0 μm and 4.0 μm of the increase in the constant channel width, as shown in FIG. 6, a region whose electric field is weak is known to be generated in a part thereof.

Figure 8:
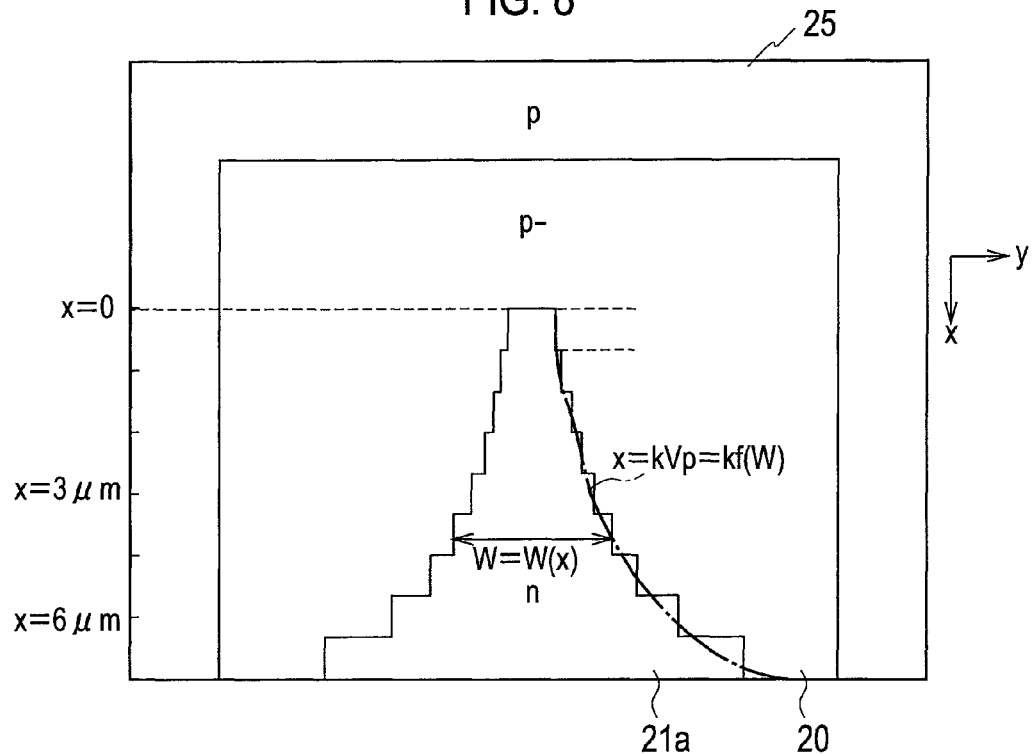
FIG. 8 is a schematic view that describes a shape of a planar pattern of the n-type surface-buried region, in a case when a ratio ΔL=ΔL(x) of an increase in a channel width is changed together with an x-coordinate, in the high-speed charge-transfer photodiode according to the first embodiment of the present invention.

For this reason, FIG. 8 shows the shape of the photodiode when the ratio ΔL=ΔL(x) of the increase in the channel width is changed together with the x-coordinate, differently from the case in which the ratio ΔL of the increase in the channel width is not constant as shown in FIG. 5. The ratio ΔL=ΔL(x) of the increase in the channel width in FIG. 8 is changed by considering the relation between the depletion potential $V_p$ shown in FIG. 4 and the width W=W(x) of the n-type surface-buried region (second conductivity type surface-buried region) 21a. Thus, in the case of the flat surface shape shown in FIG. 8, as an increase rate of the constant depletion potential $V_p$ is ΔV=0.4V, 0.9V and 1.2V, the inner electric field is made constant.

Figure 9:
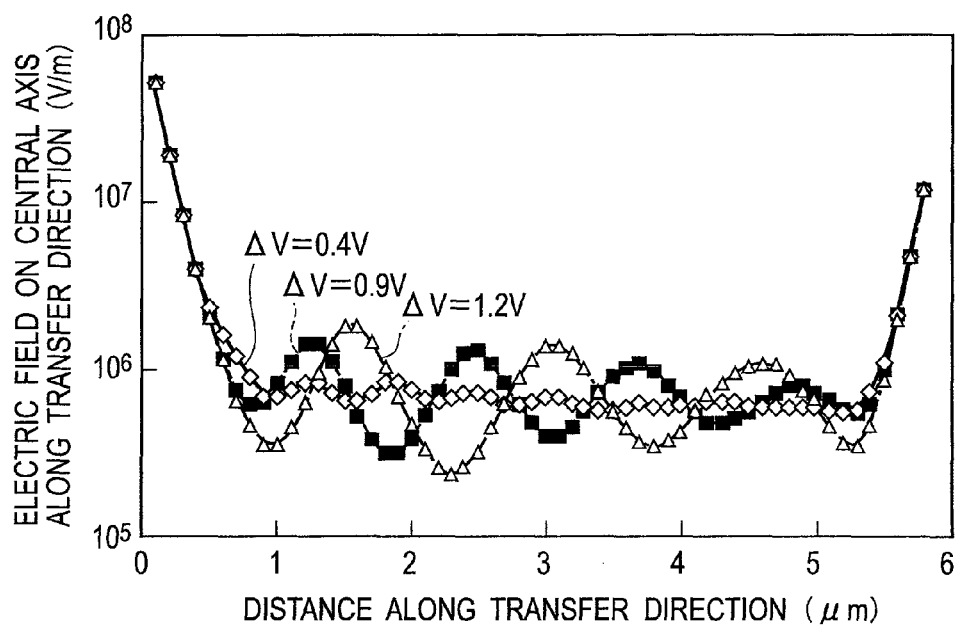
FIG. 9 is a view that shows a relation between the electric field distribution on the central axis of the n-type surface-buried region along the charge-transfer direction and the generation position of the electrons along the charge-transfer direction, in the case of the flat surface shape of the n-type surface-buried region shown in FIG. 8.
Figure 10:
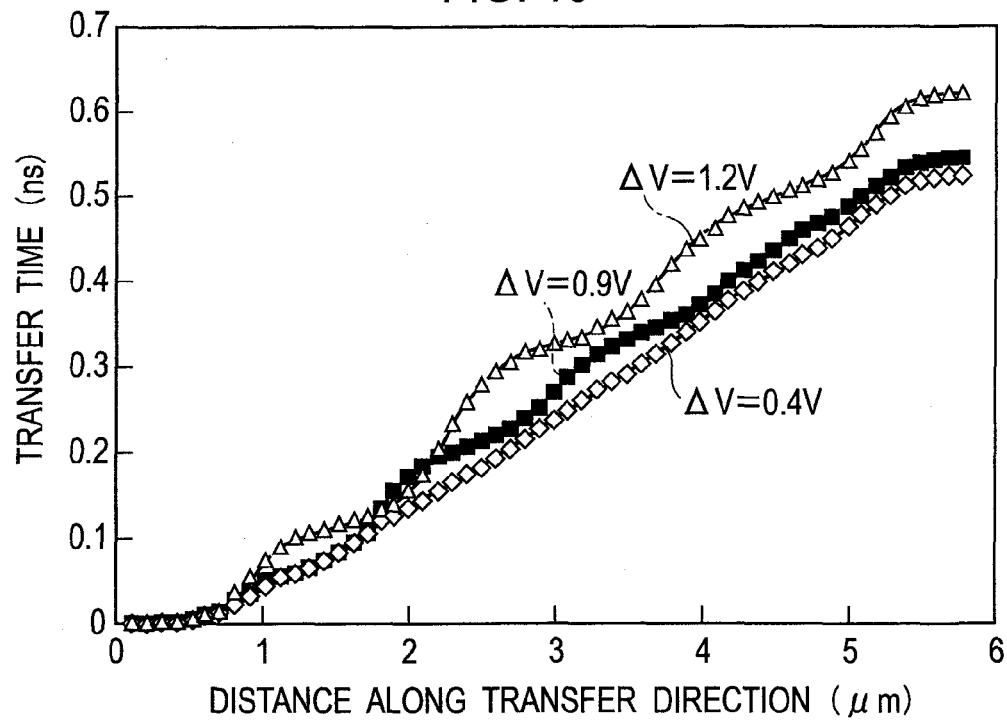
FIG. 10 is a view that shows a relation between the generation position of the electrons along the charge-transfer direction and the time required to transfer the electrons, in the case of the flat surface shape of the n-type surface-buried region shown in FIG. 8.

FIG. 9 shows a relation between the electric field distribution on the central axis of the n-type surface-buried region (second conductivity type surface-buried region) 21a along the charge-transfer direction toward the charge-collection region 27 and the generation position of the electrons along the charge-transfer direction, in the case of the flat surface shape shown in FIG. 8. FIG. 10 shows a relation between the generation position of the electrons along the charge-transfer direction and the time required to transfer the electrons. In the case of the flat surface shape shown in FIG. 8, it is known that the inner electric field is constant, the entirely high electric field is held, and the transfer time is short as compared with FIG. 7 corresponding to the shape of FIG. 5. In both of the cases of FIGS. 5 and 8, when the step width ΔL/2=ΔL(x)/2 of the stage is reduced, the transfer time tends to be entirely short. However, there is not the extreme difference.

In addition, in FIGS. 2, 5 and 8, the width W=W(x) of the n-type surface-buried region (second conductivity type surface-buried region) 21a that is measured toward the charge-collection region 27 along the y-direction is discretely changed in the staircase style. However, when it is allowed as a mask pattern used in a lithography technique, it may be continuously changed. Also, depending on a problem on a process such as an optical effectiveness in a transcribing process of the pattern in the lithography technique and the like, even if the mask pattern has the staircase style, with regard to an actual finish, the edge of the pattern is shaded, thereby enabling the continuous pattern. In particular, as shown in FIG. 8, along a curve satisfying Eqs. (1), (2), the width W=W(x) of the n-type surface-buried region (second conductivity type surface-buried region) 21a is preferred to be continuously changed.

The charge transfer in the lock-in pixel pertaining to the first embodiment shown in FIG. 2 is carried out at the high speed because this is accelerated by the electric field toward the charge-collection region 27, and the charges are collected into the charge-collection region 27. For example, when the light pulse is emitted as shown in FIG. 11, the charges caused by the light pulse emitted in the period of the control-pulse signal TX1=1V are transferred to the first floating-diffusion region 23a on the right oblique lower side from the charge-collection region 27, and the charges caused by the light pulse emitted in the period of the control-pulse signal TX2=1V are transferred to the second floating-diffusion region 23b on the left oblique lower side from the charge-collection region 27.

At the timing shown in FIG. 11, when the first transfer gate electrode 11a and the second transfer gate electrode 11b shown in FIG. 2 are alternately opened, charges $Q_1$, $Q_2$ accumulated in the first floating-diffusion region 23a and the second floating-diffusion region 23b, respectively, are represented by the following equations, respectively.

$$Q_1 = I_p(T_o - T_d) \quad (5)$$

$$Q_2 = I_p T_d \quad (6)$$

Here, the $I_p$ is the optical current generated in the photodiode, the $T_d$ is the delay time of a reception light, and the $T_o$ is the width of the pulse of the light. Consequently, the delay time of the light pulse is determined by the following equation.

$$T_d = T_O(Q_2/(Q_1+Q_2)) \quad (7)$$

A distance L from the target sample 92 shown in FIG. 1 is determined by the following equation, when a light speed is defined as c.

$$L = (c/2)T_d = (cT_O/2)(Q_2/(Q_1+Q_2)) \quad (8)$$

Actually, it is preferable to repeatedly project the light pulse, get the accumulation electrons of a sufficient quantity, make SNR high and improve a distance resolution.

The first embodiment of the present invention includes a reducing function of the influence of the background light caused by synchronization with active illumination, in addition to the structure of transferring the signal charges $Q_1$, $Q_2$ as mentioned above. That is, in order to remove the influence of the background light, the exhausting gate electrode 12 for carrying out a synchronous operation with the active illumination is provided in the downward direction of the charge-collection region 27 on the plan view of FIG. 2, and through the exhausting gate electrode 12, the background-light charges are extracted from the charge-collection region 27 to the extracting drain region 24 serving as a discharge opening.

A control-pulse signal TXD is given to the exhausting gate electrode 12, and as shown in the timing view of FIG. 11, a time interval of the control-pulse signal TXD added to the exhausting gate electrode 12 is made longer than time intervals of the control-pulse signals TX1, TX2 added to the first transfer gate electrode 11a and the second transfer gate electrode 11b. That is, in the period in which the light pulse is not projected, the potential of the control-pulse signal TXD is made high, and the background-light charges generated by the background light are discharged to the extracting drain region 24. When the control-pulse signal TX1 is given to the first floating-diffusion region 23a and also the control-pulse signal TX2 is given to the second transfer gate electrode 11b so that the signal charges are distributed to the right and left sides, a negative voltage (for example, TXD=−2V) is given to the exhausting gate electrode 12, and the potential barrier is generated, thereby avoiding the charges from being transferred from the charge-collection region 27 to the extracting drain region 24. On the other hand, when the background-light charges are discharged, the high potential (for example, 1 V) is given to the exhausting gate electrode 12 so that the transferring of the background-light charges to the extracting drain region 24 is made easy.

As mentioned above, according to the lock-in pixel pertaining to the first embodiment, the predetermined voltage is applied to the exhausting gate electrode 12, the background-light charges are transferred to the extracting drain region 24, and the influence of the background light can be suppressed. When the background light is included in the signal, there is shot noise in the light. Thus, when there are the background-light charges, the shot noise causes a distance measurement precision to be dropped. However, according to the lock-in pixel pertaining to the first embodiment, the background-light charges can be effectively removed, which can achieve the high distance measurement precision (distance resolution) and the maximum distance measurement range.

Moreover, the background-light charges can be protected from being accumulated in the first floating-diffusion region 23a and the second floating-diffusion region 23b from the charge-collection region 27, and the most use of the capacitances of the first floating-diffusion region 23a and the second floating-diffusion region 23b can be made to accumulate the signal charges. Thus, a wide dynamic range can be achieved. Moreover, when the dynamic range is represented by the maximum value of the signal and the noise level, the noise caused by the background-light charges is reduced, thereby increasing the dynamic range.

<Operation of Solid-State Imaging Device>

The operation of the solid-state imaging device (two-dimensional lock-in image sensor) pertaining to the first embodiment of the present invention in which the schematic configuration is shown in FIG. 1 is described by using the timing view of FIG. 11.

(a) For the first reset gate electrode and the second reset gate electrode in each of all of the pixels $X_{11}$ to $X_{1m}$; $X_{21}$ to $X_{2m}$; - - - ; $X_{n1}$ to $X_{nm}$ shown in FIG. 1, all of the control signals R are set to the high "H" level, and the charges accumulated in the first floating-diffusion region 23a and the second floating-diffusion region 23b are discharged to the first reset gate electrode and the second reset gate electrode, respectively, and the first floating-diffusion region 23a and the second floating-diffusion region 23b are reset.

(b) After that, the pulsed light is emitted from the light source 91, and the pulsed light reflected by the target sample 92 is entered through the aperture 42 of each of the pixels $X_{11}$ to $X_{1m}$; $X_{21}$ to $X_{2m}$; - - - ; $X_{n1}$ to $X_{nm}$ to each of the high-speed charge-transfer photodiodes 2. Synchronous with this, the repetitive pulses TX1, TX2 are given to the first transfer gate electrode 11a and the second transfer gate electrode 11b in each of all of the pixels $X_{11}$ to $X_{1m}$; $X_{21}$ to $X_{2m}$; - - - ; $X_{n1}$ to $X_{nm}$, all at once at the timing shown in FIG. 11, and they are operated for a certain period.

(c) After that, the output of the pulsed light from the light source 91 is stopped, and the voltages of the first floating-diffusion region 23a and the second floating-diffusion region 23b are read out to the outside by using the voltage reading buffer amplifier 82. In this reading period, in order to prevent the charges generated by a background light signal from being captured in the first floating-diffusion region 23a and the second floating-diffusion region 23b, a negative voltage is given to the first transfer gate electrode 11a and the second transfer gate electrode 11b, and a positive high voltage is given to the exhausting gate electrode 12.

(d) As for the reading, they are read out to the noise-cancel processing circuits $NC_1$ to $NC_m$ of the corresponding column, for each horizontal line, and in each of the noise-cancel processing circuits $NC_1$ to $NC_m$, a noise canceling circuit 83 and a noise canceling circuit 84 carry out the noise cancels and then carry out the horizontal scanning. The selection of one horizontal line is carried out by giving the control signal S to the pixel selecting switching transistors MS1, MS2 in the voltage reading buffer amplifier 82 inside each of the pixels $X_{11}$ to $X_{1m}$; $X_{21}$ to $X_{2m}$; - - - ; $X_{n1}$ to $X_{nm}$. Then, the signal of the horizontal line corresponding to the vertical signal appears. In order to reduce fixed pattern noise generated by the voltage reading buffer amplifier 82 inside in each of the pixels $X_{11}$ to $X_{1m}$; $X_{21}$ to $X_{2m}$; - - - ; $X_{n1}$ to $X_{nm}$ and a 1/f noise, the circuit for obtaining a difference between the signal level and the level when the first floating-diffusion region 23a and the second floating-diffusion region 23b are reset is the noise canceling circuit 83 and the noise canceling circuit 84. They are the circuits for sampling the signal level and the level after the resetting as φS, φR, respectively, and determining the difference. Since the noise canceling circuits themselves do not have so much relation with the essentiality of the present invention, they are omitted.

As mentioned above, according to the solid-state imaging device pertaining to the first embodiment, in addition to the effectiveness that the charges can be rapidly transferred, in each of the pixels, the predetermined voltage is applied to the exhausting gate electrode 12, and the background-light charges are transferred to the extracting drain region 24. Thus, the influence of the background light can be suppressed, thereby suppressing the shot noise caused by the background-light charges. Consequently, the high distance measurement precision (distance resolution) and the maximum distance measurement range can be achieved.

Moreover, according to the solid-state imaging device pertaining to the first embodiment, in each of the pixels, the background-light charges can be protected from being accumulated in the first floating-diffusion region 23a and the second floating-diffusion region 23b, and the most use of the capacitances of the first floating-diffusion region 23a and the second floating-diffusion region 23b can be made to accumulate the signal charges. Thus, the wide dynamic range can be achieved. Moreover, when the dynamic range is represented by the maximum value of the signal and the noise level, the noise caused by the background-light charges is reduced, thereby increasing the dynamic range.

Variation of First Embodiment

As shown in FIG. 2, in the lock-in pixel pertaining to the first embodiment, on the planar pattern, the structure having the two transfer gate electrodes, in which the first transfer gate electrode 11a and the second transfer gate electrode 11b are arranged in the right downward oblique direction and the left downward oblique direction, respectively, is exemplarily shown. However, the structure of the lock-in pixel is not limited to the flat surface structure shown in FIG. 2.

Figure 12:
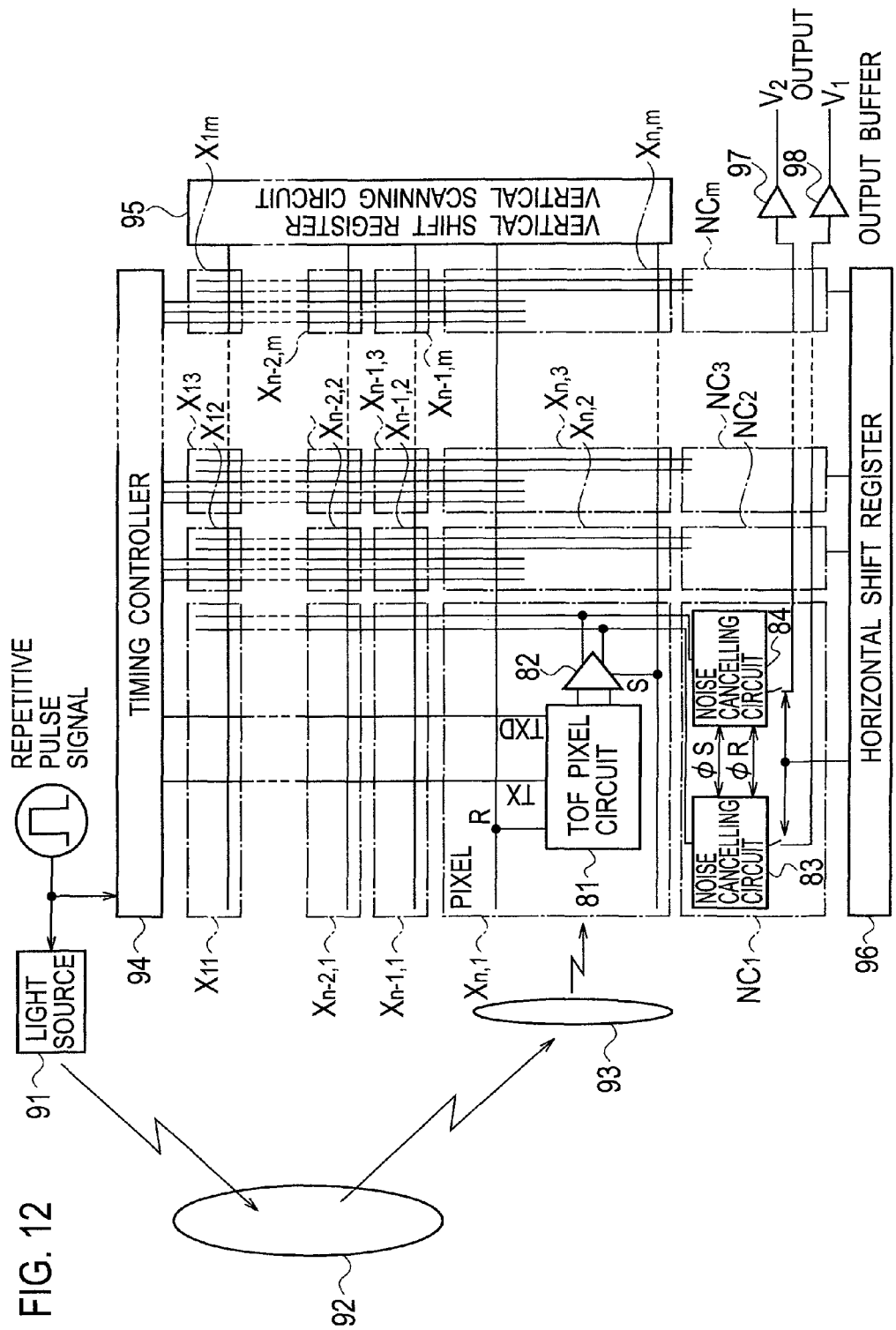
FIG. 12 is a schematic plan view describing a layout on a semiconductor chip in the solid-state imaging device (two-dimensional lock-in image sensor) according to a variation example of the first embodiment of the present invention.

In the solid-state imaging device (two-dimensional lock-in image sensor) pertaining to the variation of the first embodiment of the present invention, as shown in FIG. 12, the configuration in which the pixel array areas ($X_{11}$ to $X_{1m}$; $X_{21}$ to $X_{2m}$; - - -; $X_{n1}$ to $X_{nm}$) and the peripheral circuit areas (94, 95, 96 and $NC_1$ to $NC_m$) are integrated on the same semiconductor chip, and in the pixel array area, the unit pixel (lock-in pixel) $X_{ij}$ (i=1 to n; j=1 to m; m, n are the integers, respectively) that includes the large number of the high-speed charge-transfer photodiodes 2 in the shape of the two-dimensional matrix is arrayed is similar to the solid-state imaging device pertaining to the first embodiment shown in FIG. 1. However, as shown in FIG. 13, the structure of the lock-in pixel is different.

Figure 13:
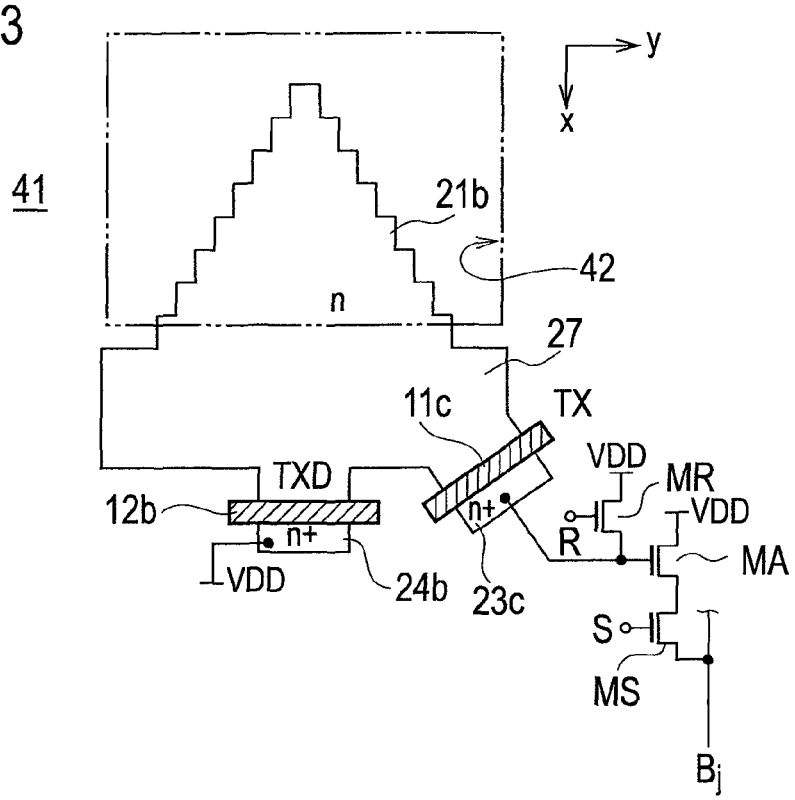
FIG. 13 is a schematic plan view describing a configuration of the lock-in pixel serving as a part of a pixel in the solid-state imaging device according to the variation of the first embodiment of the present invention.

That is, the lock-in pixel pertaining to the variation of the first embodiment shown in FIG. 13 differs from the lock-in pixel pertaining to the first embodiment shown in FIG. 2 in the structure having one transfer gate electrode. FIG. 13 shows an asynchronous topology in which a floating-diffusion region 23c for accumulating the signal charges transferred by a transfer gate electrode 11c is arranged only on the right lower side, and on the planar pattern, an exhausting gate electrode 12b is arranged on the central line in the vertical direction (upward and downward direction) in FIG. 13 with the horizontal direction as the longitudinal direction (gate-width direction). The exhausting gate electrode 12b, after collecting the background-light charges, which are generated in the charge-generation region by the background light, into the charge-collection region 27, extracts them to the downward direction of FIG. 13. The background-light charges extracted by the exhausting gate electrode 12b are received in the extracting drain region 24 provided in the lower direction of FIG. 13.

Figure 14:
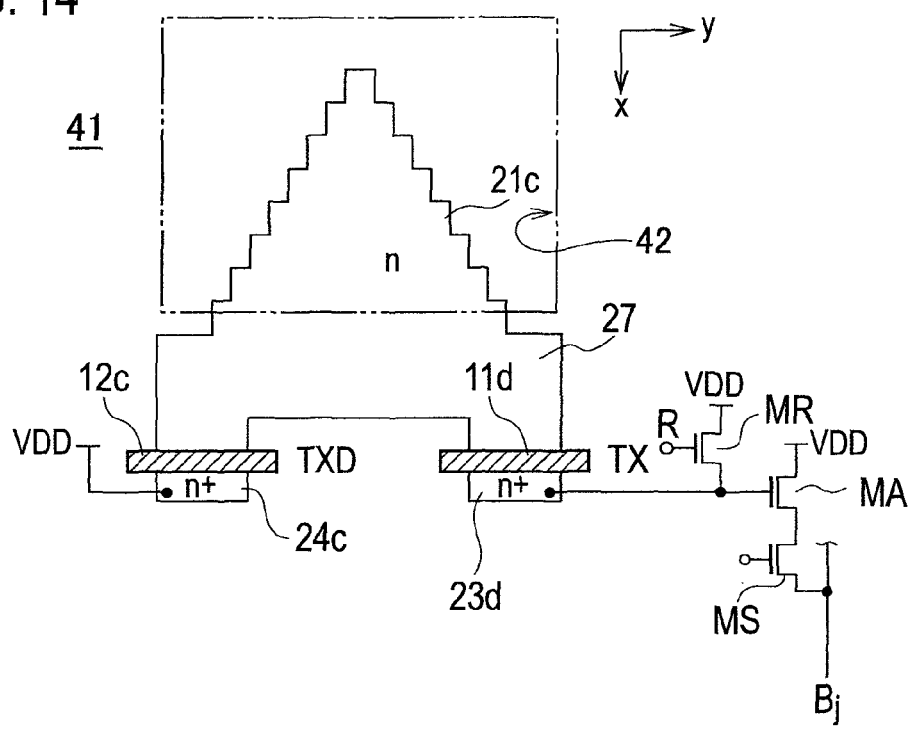
FIG. 14 is a schematic plan view describing another configuration of the lock-in pixel serving as the part of the pixel in the solid-state imaging device according to the variation of the first embodiment of the present invention.

However, the lock-in pixel pertaining to the variation of the first embodiment may be a topology in which as shown in FIG. 14, the exhausting gate electrode 12c and a transfer gate electrode 11d are arranged symmetrically with respect to the central line in the vertical direction (upward and downward direction) of FIG. 14.

On the right lower side of FIG. 13, furthermore, adjacently to the floating-diffusion region 23c, a reset gate electrode (whose illustration is omitted) and a reset source region (whose illustration is omitted) opposite to the floating-diffusion region 23c through this reset gate electrode are arranged along the right downward direction. The MOS transistors that serve as the reset transistors in the floating-diffusion region 23c, the reset gate electrode and the reset source region are formed. For the reset gate electrodes, all of the control signals R are set to the high "H" level, and the charges accumulated in the floating-diffusion region 23c are discharged to the reset source region, and the floating-diffusion region 23c is reset. As shown in FIG. 13, in the lock-in pixel pertaining to the variation of the first embodiment, in such a way that the signal charges generated by the high-speed charge-transfer photodiode 2 are transferred in the right downward oblique direction of the charge-collection region 27, on the planar pattern, the transfer gate electrode 11c is arranged with the orthogonal direction to its transfer direction as the longitudinal direction (gate-width direction), the transfer direction being aligned along the right downward oblique direction of FIG. 13. As shown in FIG. 13, the gate electrode of the signal-reading transistor (amplifying transistor) MA that implements the voltage reading buffer amplifier 82 shown in FIG. 12 is connected to the floating-diffusion region 23c. The source electrode of the signal reading transistor (amplifying transistor) MA is connected to the power source VDD, and the drain electrode is connected to the source electrode of the pixel selecting switching transistor MS. The drain electrode of the pixel selecting switching transistor MS is connected to the vertical signal line $B_j$ of the j-th column, and the control signal S for selecting the horizontal line is given to the gate electrode from the vertical shift register and vertical scanning circuit 95 (refer to FIG. 12). When the selecting control signal S is set to the high "H" level, the switching transistor MS is turned on, and the current corresponding to the potential of the floating-diffusion region 23c that is amplified by the signal reading transistor (amplifying transistor) MA flows through the vertical signal line of the j-th column.

In FIG. 14, adjacently to the floating-diffusion region 23d, a reset gate electrode (whose illustration is omitted) and a reset source region (whose illustration is omitted) opposite to the floating-diffusion region 23d through this reset gate electrode are arranged. The MOS transistors that serve as the reset transistors in the floating-diffusion region 23d, the reset gate electrode and the reset source region are formed. For the reset gate electrodes, all of the control signals R are set to the high "H" level, and the charges accumulated in the floating-diffusion region 23d are discharged to the reset source region, and the floating-diffusion region 23d is reset. As shown in FIG. 14, in the lock-in pixel pertaining to the variation of the first embodiment, in such a way that the signal charges generated by the high-speed charge-transfer photodiode 2 are transferred in the orthogonal direction through the charge-collection region 27, on the planar pattern, the transfer gate electrode 11d is arranged on the lower side of the charge-collection region 27, with the horizontal direction as the longitudinal direction (gate-width direction). As shown in FIG. 14, the gate electrode of the signal reading transistor (amplifying transistor) MA that implements the voltage reading buffer amplifier 82 shown in FIG. 12 is connected to the floating-diffusion region 23d. The source electrode of the signal reading transistor (amplifying transistor) MA is connected to the power source VDD, and the drain electrode is connected to the source electrode of the pixel selecting switching transistor MS. The drain electrode of the pixel selecting switching transistor MS is connected to the vertical signal line $B_j$ of the j-th column, and the control signal S for selecting the horizontal line is given to the gate electrode from the vertical shift register and vertical scanning circuit 95 (refer to FIG. 12). When the selecting control signal S is set to the high "H" level, the switching transistor MS is turned on, and the current corresponding to the potential of the floating-diffusion region 23d that is amplified by the signal reading transistor (amplifying transistor) MA flows through the vertical signal line $B_j$ of the j-th column.

Figure 15:
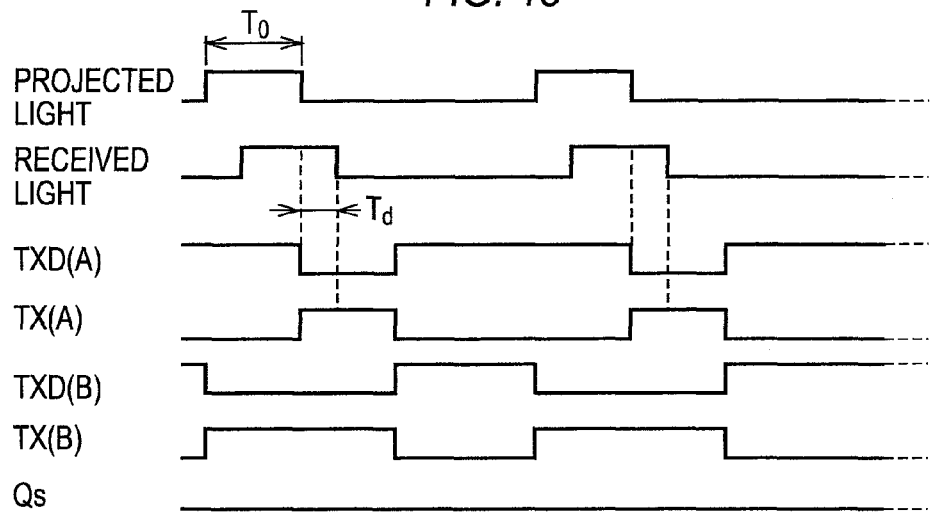
FIG. 15 is a timing chart that describes a relation of an operational timing between a pulsed light entered to a light receiving gate electrode of the lock-in pixel according to the variation of the first embodiment of the present invention and the control-pulse signals applied to the first transfer gate electrode, the second transfer gate electrode and the exhausting gate electrode.

A control pulse shown in FIG. 15 is given to the transfer gate electrodes 11c, 11d formed on the gate insulation film 32. For example, when the control-pulse signal TX1=1V is given to the transfer gate electrodes 11c, 11d, the electrons generated by the light are transferred to the floating-diffusion regions 23c, 23d on the right lower side. In this case, the exhausting gate electrodes 12b, 12c serve to extract the background-light charges, which are generated in the charge-generation region by the background light, to the downward direction of the charge-collection region 27 in FIGS. 13 and 14. Thus, the influence of the background light can be suppressed.

As shown in FIG. 13 or 14, when there are one transfer gate electrode 11c or 11d and one exhausting gate electrode 12b or 12c, as shown in the timing view in FIG. 15, in two frames, the signals that correspond to the charges (A in FIG. 15) depending on the delay time of the light pulse and the charges (B in FIG. 15) having no relation to the delay time are alternately read out to measure a distance L. Charges $Q_A$ when the charges depending on the delay time are detected are represented by the following Eq. (9).

$$Q_A = I_p T_d \tag{9}$$

Charges $Q_B$ independent of the delay time are represented by the following Eq. (10).

$$Q_B = I_p T_o \tag{10}$$

Consequently, the following equation is established.

$$T_d = T_0 (Q_A/Q_B) \tag{11}$$

Thus, from the ratio of both of the charges, the delay time of the light pulse is determined, and the distance L is measured.

Even in the lock-in pixel pertaining to the variation of the first embodiment, similarly to the lock-in pixel pertaining to the variation of the first embodiment, in addition to the effectiveness that the charges can be transferred at the high speed, the predetermined voltage is applied to the exhausting gate electrodes 12b, 12c, the background-light charges are transferred to the extracting drain regions 24b, 24c, and the synchronization with the active illumination enables the influence of the background light to be suppressed. Thus, the shot noise caused by the background-light charges can be suppressed, thereby achieving the high distance measurement precision (distance resolution) and the maximum distance measurement range. Moreover, according to the lock-in pixel pertaining to the variation of the first embodiment, the background-light charges can be protected from being accumulated in the floating-diffusion regions 23c, 23d, and the most use of the capacitances of the floating-diffusion regions 23c, 23d can be made to accumulate the signal charges. Thus, the wide dynamic range can be achieved. Moreover, when the dynamic range is represented by the maximum value of the signal and the noise level, the noise caused by the background-light charges is reduced, thereby increasing the dynamic range.

Second Embodiment

Since the entire configuration of the solid-state imaging device (the two-dimensional lock-in image sensor) pertaining to the second embodiment of the present invention is equal to the block diagram shown in FIG. 1. Thus, the duplicative descriptions are omitted. However, the structure of the lock-in pixel that serves as the TOF pixel circuit 81 inside each of the pixels (lock-in pixels) $X_{11}$ to $X_{1m}$; $X_{21}$ to $X_{2m}$; - - - ; $X_{n1}$ to $X_{nm}$ in the solid-state imaging device pertaining to the second embodiment differs from the structure of the lock-in pixel pertaining to the first embodiment, in the structure of the high-speed charge-transfer photodiode 2, as shown in FIGS. 16 and 17 (a).

Figure 16:
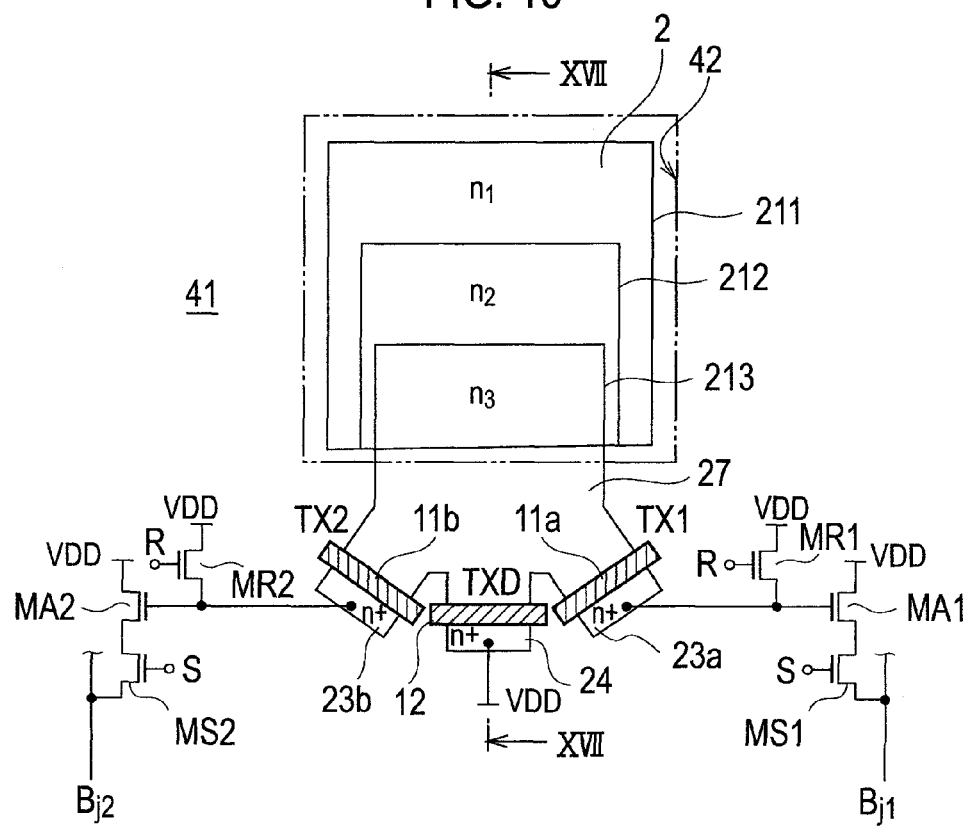
FIG. 16 is a schematic plan view describing a configuration of a pixel (lock-in pixel) in a solid-state imaging device according to a second embodiment of the present invention.
Figure 17:
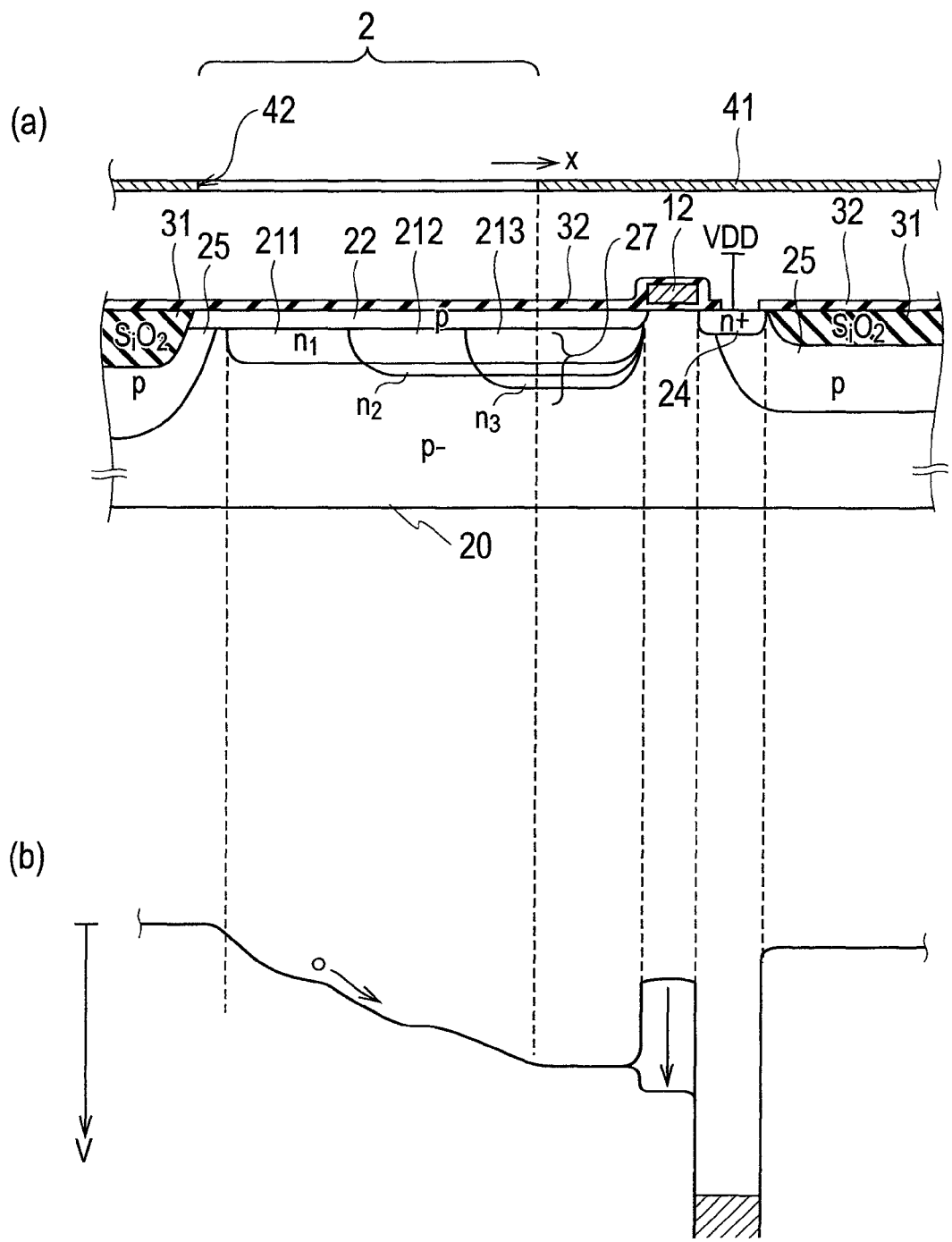
FIG. 17 (a) is a schematic cross-sectional view when viewed from XVII-XVII direction in FIG. 16, and FIG. 17 (b) is a potential diagram corresponding to FIG. 17 (a).

An idea in which just under the aperture 42 in the light shielding film 41 shown on the center in FIG. 16, the high-speed charge-transfer photodiode 2 is formed, and as the planar pattern, the charge-collection region 27 is provided on the lower side of the aperture 42 in the light shielding film 41 in FIG. 16, and on both sides of the lower side of this charge-collection region 27, the first transfer gate electrode 11a and the second transfer gate electrode 11b for alternately transferring the signal charges generated by the high-speed charge-transfer photodiode 2 from the charge-collection region 27 are arranged while being branched in the oblique direction is similar to the lock-in pixel pertaining to the first embodiment. However, in the high-speed charge-transfer photodiode 2 in the lock-in pixel pertaining to the second embodiment, toward the charge-collection region 27 along the charge-transfer direction (x-direction) as shown in FIGS. 16 and 17, an impurity concentration Nd=Nd(x) of the n-type surface-buried region (second conductivity type surface-buried region) is gradually made high in the staircase style, and the electric field is established along the direction in which the electrons can be accelerated toward the charge-transfer direction (x-direction). In the high-speed charge-transfer photodiode 2, the scheme of employing the structure for generating the acceleration electric field so as to establish a large and constant value of the electric field distribution in the charge-transfer direction, along a long distance as long as possible, differs from the lock-in pixel pertaining to the first embodiment.

In the high-speed charge-transfer photodiode 2 pertaining to the second embodiment, a relation between the depletion potential $V_p$ and the impurity concentration Nd=Nd(x) of the n-type surface-buried region (second conductivity type surface-buried region) is assumed by the following Eq. (12).

$$V_p = f(Nd) \tag{12}$$

Then, the impurity concentration Nd=Nd(x) of the n-type surface-buried region (second conductivity type surface-buried region) is controlled so as to establish the following relation Eq. (12), similarly to Eq. (2).

$$X = kV_p = kf(Nd) \tag{13}$$

Consequently, the electric field to the charge-transfer direction (x-direction) toward the charge-collection region 27 can be made constant. Here, the k is the constant, similarly to Eq. (2).

Similarly to the lock-in pixel pertaining to the first embodiment, as shown in FIG. 16, the first floating-diffusion region 23a for accumulating the signal charges transferred by the first transfer gate electrode 11a is arranged on the right lower side of the charge-collection region 27, and the second floating-diffusion region 23b for accumulating the signal charges transferred by the second transfer gate electrode 11b is arranged on the left lower side of the charge-collection region 27. Moreover, on the right lower side in FIG. 16, adjacently to the first floating-diffusion region 23a, the first reset gate electrode (whose illustration is omitted) and the first reset source region (whose illustration is omitted) opposite to the first floating-diffusion region 23a through this first reset gate electrode are arranged along the right downward oblique direction. On the other hand, on the left lower side in FIG. 16, adjacently to the second floating-diffusion region 23b, the second reset gate electrode (whose illustration is omitted) and the second reset source region (whose illustration is omitted) opposite to the second floating-diffusion region 23b through this second reset gate electrode are arranged along the left downward oblique direction. The MOS transistors serving as the first reset transistors are formed in the first floating-diffusion region 23a, the first reset gate electrode and the first reset source electrode, and the MOS transistors serving as the second reset transistors are formed in the second floating-diffusion region 23b, the second reset gate electrode and the second reset source region. For the respective first reset gate electrodes and second reset gate electrodes, all of the control signals R are set to the high (H) level, and the charges accumulated in the first floating-diffusion region 23a and the second floating-diffusion region 23b are discharged to the first reset source region and the second reset source region, respectively, and the first floating-diffusion region 23a and the second floating-diffusion region 23b are reset.

Similarly to the lock-in pixel pertaining to the first embodiment, as shown in FIG. 16, below the charge-collection region 27 on the planar pattern, the exhausting gate electrode 12 is arranged on the central line in the vertical direction (upward and downward direction) in FIG. 16, with the horizontal direction as the longitudinal direction (gate-width direction). The exhausting gate electrode 12 collects the background-light charges, which are generated in the charge-generation region by the background light, into the charge-collection region 27 and then extracts the background-light charges to the downward direction of FIG. 16 from the charge-collection region 27. The background-light charges extracted from the charge-collection region 27 by the exhausting gate electrode 12 are received in the extracting drain region 24 provided in the lower direction in FIG. 16.

FIG. 17 (a) shows a cross-sectional configuration when viewed from XVII-XVII direction of the lock-in pixel shown in FIG. 16. Then, the high-speed charge-transfer photodiode 2 shown just under the aperture 42 in the light shielding film 41 on the center in FIG. 16 includes: a first n-type surface-buried region (second conductivity type surface-buried region) 211 serving as a cathode region (second main electrode region) provided on the upper portion of the p-type semiconductor substrate (first conductivity type semiconductor layer) 20 that serves as this anode region (first main electrode region), in which the p-type semiconductor substrate (first conductivity type semiconductor layer) 20 serves as the anode region (first main electrode region); a second n-type surface-buried region (second conductivity type surface-buried region) 212 and a third n-type surface-buried region (second conductivity type surface-buried region) 213.

Similarly to the lock-in pixel pertaining to the first embodiment, in the lock-in pixel pertaining to the first embodiment, the first n-type surface-buried region 211, the second n-type surface-buried region 212 and the third n-type surface-buried region 213 serve as the charge-transfer regions. However, the first conductivity type semiconductor layer 20, which is located not only just under the first n-type surface-buried region 211, the second n-type surface-buried region 212 and the third n-type surface-buried region 213, but also located just under the opening (aperture) 42 in the light shielding film 41, serves as the charge-generation region in the high-speed charge-transfer photodiode 2 pertaining to the second embodiment. Thus, in FIGS. 16 and 17 (a), the region just under the opening (aperture) 42 is defined as the high-speed charge-transfer photodiode 2. In the high-speed charge-transfer photodiode 2, the carriers (electrons) generated in the charge-generation region are injected into the first n-type surface-buried region 211, the second n-type surface-buried region 212 and the third n-type surface-buried region 213, which are located just above the charge-generation region, respectively.

Because the region of the high-speed charge-transfer photodiode 2 is defined as mentioned above, in the lock-in pixel pertaining to the second embodiment, the charge-collection region 27 is defined as the right side region of the overlapped portion of the first n-type surface-buried region 211, the second n-type surface-buried region 212 and the third n-type surface-buried region 213 with respect to a boundary, at which the right edge of the aperture 42 in the light shielding film 41 is allocated as shown in FIG. 17 (b). That is, a semiconductor region where the first n-type surface-buried region 211, the second n-type surface-buried region 212 and the third n-type surface-buried region 213 are overlapped implements the charge-collection region 27. And, with respect to the right edge of the aperture 42 in FIG. 17 (b), which is defined as the boundary, the left side region of the overlapped portion of the first n-type surface-buried region 211, the second n-type surface-buried region 212 and the third n-type surface-buried region 213 serves as the charge-transfer region of the high-speed charge-transfer photodiode 2.

Here, so as to establish the relation of Eq. (13), an impurity concentration $Nd=n_2$ of the second n-type surface-buried region 212 is higher than an impurity concentration $Nd=n_1$ of the first n-type surface-buried region 211, and an impurity concentration $Nd=n_3$ of the third n-type surface-buried region 213 is higher than the impurity concentration $Nd=n_2$ of the second n-type surface-buried region 212. As shown in FIGS. 16 and 17, the structure in which toward the charge-transfer direction (x-direction), the impurity concentration Nd of the n-type surface-buried region becomes gradually high in the staircase style such as $n_1$, $n_2$ and $n_3$ can be controlled by a plurality of times of ion implantations. Or, the control of the dose amount equivalent to the plurality of times of ion implantations may be carried out by one time of the ion implantation, through buffer films whose ion stop performances differ from each other. The p-type pinning layer (first conductivity type pinning layer) 22 is arranged on the first n-type surface-buried region 211, the second n-type surface-buried region 212 and the third n-type surface-buried region 213. The p-type semiconductor substrate (first conductivity type semiconductor layer) 20 implementing the high-speed charge-transfer photodiode 2 serves as the charge-generation region. Thus, the impurity concentration Nd is preferred to be about $6 \times 10^{11}$ cm$^{-3}$ or more and about $2 \times 10^{15}$ cm$^{-3}$ or less. In addition, instead of the p-type semiconductor substrate 20, the structure in which the silicon epitaxial growth layer whose impurity concentration Nd is about $6 \times 10^{11}$ cm$^{-3}$ or more and about $2 \times 10^{15}$ cm$^{-3}$ or less is formed on the silicon substrate whose impurity concentration Nd is about $4 \times 10^{17}$ cm$^{-3}$ or more and about $1 \times 10^{21}$ cm$^{-3}$ or less is employed, and the silicon epitaxial growth layer may be used as the first conductivity type semiconductor region serving as the charge-generation region. The first n-type surface-buried region 211 has the impurity concentration Nd=about $2 \times 10^{15}$ cm$^{-3}$ to $1 \times 10^{17}$ cm$^{-3}$, and the second n-type surface-buried region 212 has the impurity concentration Nd=about $4 \times 10^{15}$ cm$^{-3}$ to $3 \times 10^{17}$ cm$^{-3}$, and the third n-type surface-buried region 213 has the impurity concentration Nd=about $8 \times 10^{15}$ cm$^{-3}$ to $6 \times 10^{17}$ cm$^{-3}$. Thus, they are the n-type semiconductor regions of the relatively low concentrations, and each of them is selected so as to establish the relation of Eq. (13). More preferably, the first n-type surface-buried region 211 has the impurity concentration Nd=about $5 \times 10^{15}$ cm$^{-3}$ to $1 \times 10^{17}$ cm$^{-3}$, and the second n-type surface-buried region 212 has the impurity concentration Nd=about $1 \times 10^{16}$ cm$^{-3}$ to $3 \times 10^{17}$ cm$^{-3}$, and the third n-type surface-buried region 213 has the impurity concentration Nd=about $2 \times 10^{16}$ cm$^{-3}$ to $6 \times 10^{17}$ cm$^{-3}$, and as the n-type semiconductor region of the relatively low concentration as mentioned above, the relation of Eq. (13) may be established. Typically, for example, by employing the values in which the first n-type surface-buried region 211 has the impurity concentration Nd=about $4 \times 10^{16}$ cm$^{-3}$, and the second n-type surface-buried region 212 has the impurity concentration Nd=about $8 \times 10^{16}$ cm$^{-3}$, and the third n-type surface-buried region 213 has the impurity concentration Nd=about $1.6 \times 10^{17}$ cm$^{-3}$, it is possible to establish the relation of Eq. (13). Its thickness can be about 0.1 to 3 μm, preferably, about 0.2 to 0.5 μm. The impurity concentrations Nd of the first n-type surface-buried region 211, the second n-type surface-buried region 212 and the third n-type surface-buried region 213 can be controlled by the plurality of times of ion implantations. Actually, not only by the dose amount of the ions, but also by making the acceleration voltage of the ion implantation into the second n-type surface-buried region 212 higher than the first n-type surface-buried region 211 and making the acceleration voltage of the ion implantation into the third n-type surface-buried region 213 higher than the second n-type surface-buried region 212, as shown in FIG. 17 (*a*), the method of changing the projection range of the ion is preferable from the practical standpoint. The p-type pinning layer (first conductivity type pinning layer) 22 has the relatively high concentration of the impurity concentration Nd between about $3\times10^{17}$ cm$^{-3}$ and $1.5\times10^{20}$ cm$^{-3}$, and its thickness may be between about 20 nm and 1.0 μm, preferably, between about 50 nm and 300 nm.

The gate insulation film 32 shown in FIG. 17 (*a*) extends to below the first transfer gate electrode 11*a* and the second transfer gate electrode 11*b* that are located on the left and right sides of the lower portion of the aperture 42 in the light shielding film 41 in FIG. 16, although the illustration is omitted in FIG. 17 (*a*). FIG. 17 (*a*) shows a situation in which the gate insulation film 32 extends from just under the aperture 42 in the light shielding film 41 to below the exhausting gate electrode 12 in the right direction in FIG. 17 (*a*) (corresponds to the downward direction in FIG. 16). As shown in FIG. 17 (*a*), below the gate insulation film 32, the first n-type surface-buried region 211, the second n-type surface-buried region 212 and the third n-type surface-buried region 213 are arranged so as to extend in the left and right directions from just under the aperture 42 in the light shielding film 41 to just under the left end of the exhausting gate electrode 12. That is, in a part of the first conductivity type semiconductor layer 20 that is adjacent to the right side of the charge-collection region 27 defined on the right portion of the third n-type surface-buried region 213, a portion located just under the exhausting gate electrode 12 serves as the exhausting channel. Then, the exhausting gate electrode 12 electro-statically controls the potential of the exhausting channel through the gate insulation films 32 formed on the upper portions of these exhausting channels, respectively, and transfers the background-light charges from the charge-collection region 27 through the exhausting channel to the extracting drain region 24 of the second conductivity type (n-type). The extracting drain region 24 is the semiconductor region of the impurity concentration Nd higher than the first n-type surface-buried region 211, the second n-type surface-buried region 212 and the third n-type surface-buried region 213.

Although the illustration is omitted in FIG. 17 (*a*), as can be understood from the plan view of FIG. 16, the first n-type surface-buried region 211, the second n-type surface-buried region 212 and the third n-type surface-buried region 213 extend to just under the ends of the first transfer gate electrode 11*a* and the second transfer gate electrode 11*b* from just under the aperture 42, below the gate insulation film 32. That is, in FIG. 16, in a part of the first conductivity type semiconductor layer 20 adjacent to the right lower side of the third n-type surface-buried region 213 serving as the charge-collection region 27, a portion located just under the first transfer gate electrode 11*a* serves as the first transfer channel. On the other hand, in another part of the first conductivity type semiconductor layer 20 adjacent to the left lower side of the third n-type surface-buried region 213 serving as the charge-collection region 27 just under the aperture 42 above the charge-generation region), a portion located just under the second transfer gate electrode 11*b* serves as the second transfer channel. Then, the first transfer gate electrode 11*a* and the second transfer gate electrode 11*b* electro-statically control the potentials of the first and second transfer channels through the gate insulation films 32 formed on the upper portions of these first and second transfer channels, respectively, and alternately transfer the signal charges through the first and second transfer channels, from the charge-collection region 27 to the first floating-diffusion region 23*a* and the second floating-diffusion region 23*b* of the second conductivity type (n-type), respectively. The first floating-diffusion region 23*a* and the second floating-diffusion region 23*b* are the semiconductor regions of the impurity concentrations higher than the first n-type surface-buried region 211, the second n-type surface-buried region 212 and the third n-type surface-buried region 213, respectively.

As shown in FIG. 16, the gate electrode of the signal reading transistor (amplifying transistor) MA1 implementing the voltage reading buffer amplifier 82 shown in FIG. 1 is connected to the first floating-diffusion region 23*a*, and the gate electrode of the signal reading transistor (amplifying transistor) MA2 in the voltage reading buffer amplifier 82 is connected to the second floating-diffusion region 23*b*. The source electrode of the signal reading transistor (amplifying transistor) MA1 is connected to the power source VDD, and the drain electrode is connected to the source electrode of the pixel selecting switching transistor MS1. The drain electrode of the pixel selecting switching transistor MS1 is connected to the vertical signal line $B_{j1}$ of the j-th column, and the control signal S for selecting the horizontal line is given to the gate electrode by the vertical shift register and vertical scanning circuit 95. The source electrode of the signal reading transistor (amplifying transistor) MA2 is connected to the power source VDD, and the drain electrode is connected to the source electrode of the pixel selecting switching transistor MS2. The drain electrode of the pixel selecting switching transistor MS2 is connected to the vertical signal line $B_{j2}$ of the j-th column, and the control signal S for selecting the horizontal line is given to the gate electrode by the vertical shift register and vertical scanning circuit 95. When the selecting control signal S is set to the high "H" level, the switching transistors MS1, MS2 are turned on, and the currents corresponding to the potentials of the first floating-diffusion region 23*a* and the second floating-diffusion region 23*b* that are amplified by the signal reading transistors (amplifying transistors) MA1, MA2 flow through the vertical signal lines $B_{j1}$, $B_{j2}$ of the j-th column.

FIG. 17 (*a*) shows the example in which as the field insulation film 31 between the gate insulation film 32 and the well 25, the buried insulation film (buried oxide film) of the shallow trench isolation (STI) structure that is used for the element separation in the hyperfine integrated circuit is used. However, as the field insulation film 31, it is possible to use the different insulation films, such as the field oxide film formed by the selection oxide method referred to as the LOCOS method used for the element separation, and the like.

When the field insulation film 31 and the gate insulation film 32 are formed by the thermal oxide film, the thickness of the thermal oxide film may be about 150 nm or more and about 1000 nm or less, preferably, about 200 nm or more and about 400 nm or less. When the gate insulation film 32 is formed by the dielectric film except the thermal oxide film, its thickness may be the equivalent thickness that is converted on the basis of the dielectric constant $\in_r$ of the thermal oxide film ($\in_r=3.8$, at 1 MHz). For example, when the CVD oxide film having the dielectric constant of $\in_r=4.4$ is used, the thickness in which the above thickness is multiplied by $4.4/3.8=1.16$ may be used, and when the silicon nitride (Si$_3$N$_4$) film having the dielectric constant of $\in_r=7$ is used, the thickness in which the above thickness is multiplied by $7/3.8=1.84$ may be used.

However, it is preferable to use the oxide film (SiO$_2$ film) formed by the standard CMOS technique. The use of the field oxide film in the CMOS technique is suitable for simplifying the manufacturing step.

The control-pulse signals TX1, TX2 similar to those exemplified in FIG. 11 are given to the first transfer gate electrode 11a and the second transfer gate electrode 11b that are formed on the gate insulation film 32. For example, when the control-pulse signal TX1=1V is given to the first transfer gate electrode 11a and the control-pulse signal TX2=−2V is given to the second transfer gate electrode 11b, the potential barrier for the electrons inside the first n-type surface-buried region 211, the second n-type surface-buried region 212 and the third n-type surface-buried region 213 are decreased, and the electrons generated by the light are transferred to the first floating-diffusion region 23a on the right lower side. Reversely, when the control-pulse signal TX1=−2V is given to the first transfer gate electrode 11a and the control-pulse signal TX2=1V is given to the second transfer gate electrode 11b, the electrons generated by the light is transferred to the second floating-diffusion region 23b on the left lower side.

FIG. 17 (b) shows the potential diagram of the depletion potential $V_p$ corresponding to the cross-sectional configuration of the high-speed charge-transfer photodiode 2 pertaining to the second embodiment shown in FIG. 17 (a). As shown in FIG. 17 (b), the relation of Eq. (13) is designed to be approximately established by gradually making the impurity concentration Nd=Nd(x) of the n-type surface-buried region high in the staircase style, as it approaches the charge-collection region 27 along the charge-transfer direction (x-direction) of the charges. Thus, in the high-speed charge-transfer photodiode 2 pertaining to the second embodiment, the depletion potential $V_p$ with respect to the x-direction becomes gradually great as it approaches the direction of the right charge-collection region 27. Consequently, in the high-speed charge-transfer photodiode 2 pertaining to the second embodiment, the electric field that is great in the x-direction toward the charge-collection region 27 is generated in the wide range.

In addition, FIGS. 16 and 17 exemplarily show the case in which the three n-type surface-buried regions of the first n-type surface-buried region 211, the second n-type surface-buried region 212 and the third n-type surface-buried region 213 are provided and along the charge-transfer direction (x-direction) toward the charge-collection region 27, the impurity concentration Nd=Nd(x) of the n-type surface-buried region is gradually made high in the staircase style. However, this is not limited to the three n-type surface-buried regions. If the electric field can be generated in the direction in which the electrons are accelerated toward the charge-transfer direction (x-direction) so that the relation of Eq. (13) can be approximately established, the number of the n-type surface-buried regions may be four or more.

Although there is a problem that the process flow is complicated, the high-speed charge-transfer photodiode 2 is preferably configured such that along the charge-transfer direction (x-direction), the number of the n-type surface-buried regions is increased, thereby minimizing an increase rate ΔNd of the impurity concentration of the n-type surface-buried regions adjacent to each other, and consequently, a large and constant value of the electric field distribution is established in the charge-transfer region, along a long distance as long as possible. That is, in FIGS. 16 and 17, although the impurity concentration Nd=Nd(x) of the n-type surface-buried region is changed discretely in the staircase style, ideally, the impurity concentration Nd=Nd(x) of the n-type surface-buried region is preferred to be continuously changed along the curve that satisfies Eqs. (12), (13). In order to continuously change the impurity concentration Nd=Nd(x), it is effective to carry out the ion implantation through the buffer film whose thickness is continuously changed so that the ion stop performance is continuously changed.

The charge transfer in the lock-in pixel pertaining to the second embodiment shown in FIG. 16 is carried out at the high speed because this is accelerated toward the charge-collection region 27 by the electric field, similarly to the lock-in pixel pertaining to the first embodiment. For example, when the light pulse is emitted as described in the solid-state imaging device pertaining to the first embodiment as shown in FIG. 11, the charges caused by the light pulse emitted in the period of the control-pulse signal TX1=1V are transferred from the charge-collection region 27 to the first floating-diffusion region 23a on the right oblique lower side, and the charges caused by the light pulse emitted in the period of the control-pulse signal TX2=1V are transferred from the charge-collection region 27 to the second floating-diffusion region 23b on the left oblique lower side, and the distance L from the target sample 92 shown in FIG. 1 is determined from Eq. (8). The second embodiment of the present invention includes the reducing function of the influence of the background light caused by the synchronization with the active illumination, in addition to the structure of transferring the signal charges $Q_1$, $Q_2$, similarly to the solid-state imaging device pertaining to the first embodiment. That is, in order to remove the influence of the background light, the exhausting gate electrode 12 for carrying out the synchronous operation with the active illumination is provided in the downward direction of the charge-collection region 27 on the plan view of FIG. 16, and through the exhausting gate electrode 12, the background-light charges are discharged to the extracting drain region 24 serving as the discharge opening. The control-pulse signal TXD is given to the exhausting gate electrode 12, and as shown in the timing view of FIG. 11, the time interval of the control-pulse signal TXD added to the exhausting gate electrode 12 is made longer than the time intervals of the control-pulse signals TX1, TX2 added to the first transfer gate electrode 11a and the second transfer gate electrode 11b. That is, in the period in which the light pulse is not projected, the potential of the control-pulse signal TXD is made high, and the background-light charges generated by the background light are discharged from the charge-collection region 27 to the extracting drain region 24. When the control-pulse signal TX1 is given to the first floating-diffusion region 23a and also the control-pulse signal TX2 is given to the second transfer gate electrode 11b so that the signal charges are distributed to the right and left sides, the negative voltage (for example, TXD=−2V) is given to the exhausting gate electrode 12, and the potential barrier is generated, thereby avoiding the charges from being transferred from the charge-collection region 27 to the extracting drain region 24. On the other hand, when the background-light charges are discharged, the high potential (for example, 1 V) is given to the exhausting gate electrode 12 so that the transferring of the background-light charges to the extracting drain region 24 from the charge-collection region 27 is made easy.

The others are substantially similar to the lock-in pixel pertaining to the first embodiment. Thus, the duplicative descriptions are omitted. However, similarly to the lock-in pixel pertaining to the first embodiment, even by the lock-in pixel pertaining to the second embodiment, the influence of the background light can be effectively reduced, thereby achieving the high distance measurement precision (distance resolution), the wide maximum distance measurement range and the dynamic range.

Also, even in the solid-state imaging device based on the two-dimensional array when the lock-in pixel pertaining to the second embodiment is configured as the pixel, similarly to the solid-state imaging device pertaining to the first embodiment, in addition to the effectiveness that the charges can be transferred at the high speed, the influence of the background light can be effectively reduced, thereby achieving the high distance measurement precision (distance resolution), the wide maximum distance measurement range and the dynamic range.

Other Embodiments

As mentioned above, the present invention has been described on the basis of the first and second embodiments. However, the discussions and drawings that configure the part of this disclosure should not be understood to limit the present invention. From this disclosure, the various variation embodiments, implementations and operational techniques would be evident for one skilled in the art.

For example, the first embodiment shown in FIG. 2 exemplifies the structure in which on both the sides of the lower side of the charge-collection region 27, the first transfer gate electrode 11a and the second transfer gate electrode 11b, which after collecting the signal charges generated by the high-speed charge-transfer photodiode 2 into the charge-collection region 27, alternately transfer them, are arranged while being branched in the oblique directions, and furthermore the first floating-diffusion region 23a for accumulating the signal charges transferred by the first transfer gate electrode 11a is arranged on the right lower side, and the second floating-diffusion region 23b for accumulating the signal charges transferred by the second transfer gate electrode 11b is arranged on the left lower side. However, a structure may be employed in which in the flat surface structure shown in FIG. 2, a third transfer gate electrode for further transferring the charges transferred to the first floating-diffusion region 23a and a fourth transfer gate electrode for further transferring the charges transferred to the second floating-diffusion region 23b are arranged while being branched in an oblique right direction and an oblique left direction, respectively, and a third floating-diffusion region for accumulating the signal charges transferred by the third transfer gate electrode is arranged on its right lower side, and a fourth floating-diffusion region for accumulating the signal charges transferred by the fourth transfer gate electrode is arranged on its left lower side, and they are transferred at two stages. Even the structure shown in FIGS. 13, 14 and 16 and the like can similarly employ the structure for tandem transferring at the two stages.

Moreover, with the combination of the already-described first and second embodiments, the width W=W(x) of the n-type surface-buried region 21a is gradually widened, and simultaneously with it, the impurity concentration Nd=Nd(x) of the n-type surface-buried region is gradually made high. Then, with their synergetic effectiveness, the electric field is established in the direction in which the electrons are accelerated toward the charge-transfer direction (x-direction). By using this, the electric field distribution in the charge-transfer region may be designed to have the large and constant value, along a long distance as long as possible.

Moreover, in the descriptions of the already-described first and second embodiments, the solid-state imaging device that includes the reducing function of the influence of the background light caused by the synchronization with the active illumination is exemplarily described. However, depending on the request from the specification of the intended solid-state imaging device or the like, by omitting the exhausting gate electrodes 12, 12b and 12c, it is possible not to have the reducing function of the influence of the background light caused by the synchronization with the active illumination.

Moreover, in the descriptions of the already-described first and second embodiments, the TOF range-finding image sensor is exemplarily described. However, the high-speed charge-transfer photodiode 2 of the present invention can be applied to the various solid-state imaging devices, such as the bio imaging solid-state imaging device for measuring the fluorescence from the dyed living cell and the fluorescence life, or the time correlation image sensor for carrying out the various measurements and the like, in addition to the TOF range-finding image sensor. As for the measurement of the fluorescence, similarly to the explanation in JP-2008-103647A, an excitation light pulse reflected by the target sample and the a fluorescence light generated from the target sample when this excitation light pulse is received are measured by the solid-state imaging device of the present invention. Then, in a certain period after the falling of the excitation light pulse, the signal charges are selectively transferred from the n-type surface-buried region to the floating-diffusion region, and when the excitation light is emitted, the charges may be extracted from the n-type surface-buried region to the exhausting drain region. Or, similarly to the explanation in JP-2008-103647A, the excitation light pulse reflected by the target sample and the a fluorescence light generated from the target sample when this excitation light pulse is received are measured by the solid-state imaging device of the present invention, and in a first period after the falling of the excitation light pulse, a part of the signal charges is transferred from the n-type surface-buried region to the floating-diffusion region, and the signal charges accumulated in the floating-diffusion region are read out as a first accumulation charge amount, and in a second period after the first period, the other part of the signal charges is transferred from the n-type surface-buried region to the floating-diffusion region. Then, the signal charges accumulated in the floating-diffusion region are read out as a second accumulation charge amount, and the life time of the fluorescence light may be measured, from a ratio between the first and second accumulation charge amounts.

Moreover, the already-described first and second embodiments are described such that the first conductivity type is the p-type and the second conductivity type is the n-type. However, even under the assumption that the first conductivity type is the n-type and the second conductivity type is the p-type, when the electrical polarities are reversed, the fact that the similar effectiveness is obtained can be easily understood.

Figure 18:
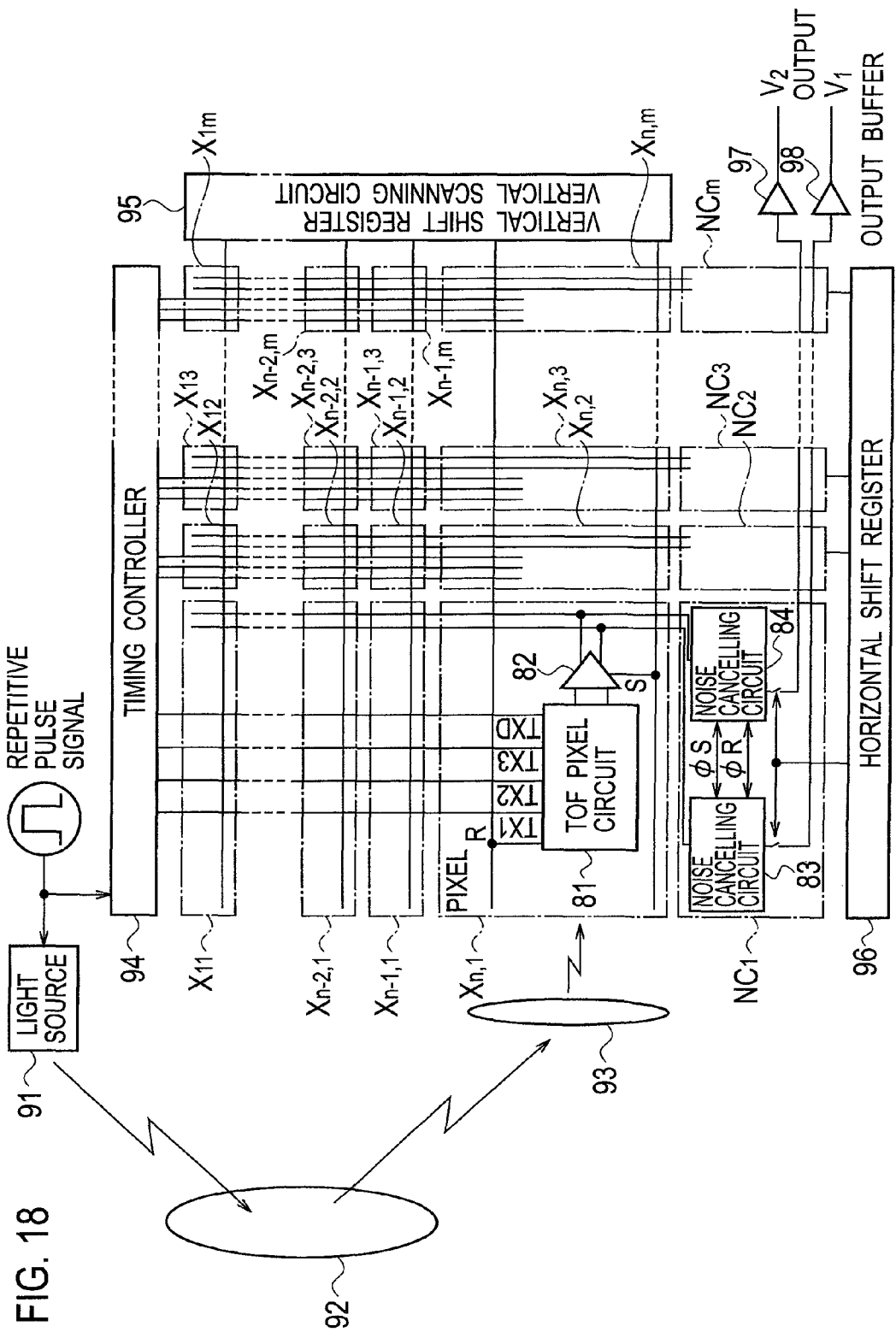
FIG. 18 is a schematic plan view describing a layout on a semiconductor chip in a solid-state imaging device (two-dimensional lock-in image sensor) according to another embodiment of the present invention.
Figure 19:
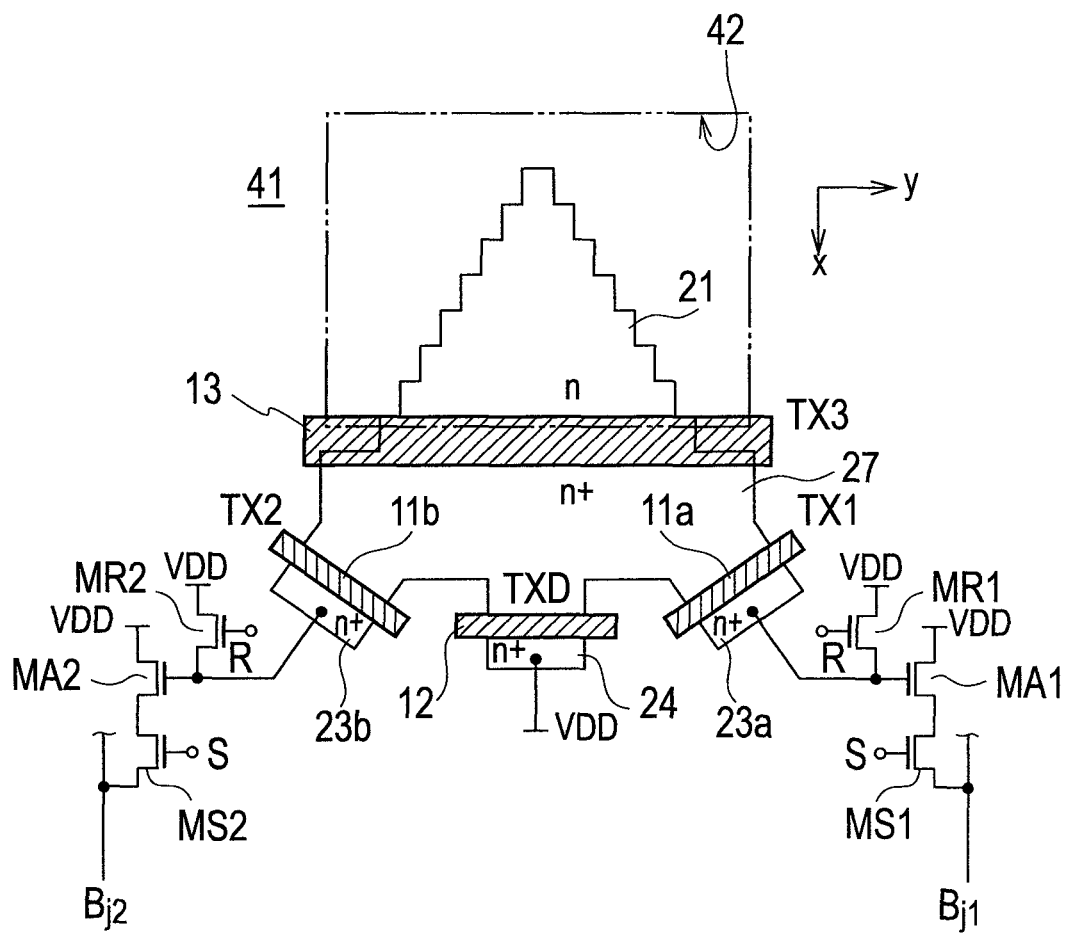
FIG. 19 is a schematic plan view describing a configuration of a pixel (lock-in pixel) in the solid-state imaging device according to another embodiment shown in FIG. 18.

As the solid-state imaging device (two-dimensional lock-in image sensor) pertaining to another embodiment, as shown in FIG. 18, it is possible to employ a configuration in which the pixel array areas ($X_{11}$ to $X_{1m}$; $X_{21}$ to $X_{2m}$; ---; $X_{n1}$ to $X_{nm}$) and the peripheral circuit areas (94, 95, 96 and $NC_1$ to $NC_m$) are integrated on the same semiconductor chip, and the unit pixel (lock-in pixel) $X_{ij}$ that includes the large number of the high-speed charge-transfer photodiodes 2 in the shape of the two-dimensional matrix is arrayed. The solid-state imaging device shown in FIG. 18 is basically similar to the solid-state imaging device pertaining to the first embodiment shown in FIG. 1. However, as shown in FIG. 19, the structure of the lock-in pixel is different. That is, as shown in FIG. 19, a charge accumulation gate 13 is provided on the side of the lower portion of the rectangular aperture 42 in the light shielding film 41 shown on the center. Then, after the carriers (electrons) generated in the charge-generation region just under the aperture 42 are once accumulated in the charge-collection region 27 that is the n-type floating-diffusion region separated from the n-type surface-buried region 21a, the control-pulse signal is given to the first transfer gate electrode 11a and the second transfer gate electrode 11b, and the carrier (electrons) accumulated in the charge-collection region 27 may be alternately transferred to the first floating-diffusion region 23a on the right lower side and the second floating-diffusion region 23b on the left lower side. As shown in FIG. 18, a charge accumulation signal TX3 is applied to the charge accumulation gate 13 from a timing control circuit.

Also, in the descriptions of the already-described first and second embodiments, the TOF type range-finding image sensor as the two-dimensional solid-state imaging device (area sensor) is exemplarily described. However, the lock-in pixel of the present invention should not be limitedly construed to be used only in the pixel of the two-dimensional solid-state imaging device. A fact in which, for example, in the two-dimensional matrix shown in FIG. 1, as the pixel of one-dimensional solid-state imaging device (line sensor) of j=m=1, a plurality of lock-in pixels can be one-dimensionally arrayed can be easily understood from the content of the above disclosure.

In this way, the present invention may naturally include various embodiments not described herein. Therefore, the technical scope of the present invention should be defined only by features for specifying the invention according to the appended claims that are regarded appropriate according to the above description.

INDUSTRIAL APPLICABILITY

The high-speed charge-transfer photodiode of the present invention and the lock-in pixel having the high-speed charge-transfer photodiode can be used in the technical field on the wide industry, such as an in-car camera, a security camera, an industrial camera, a bio measuring camera and the like, as a range-finding image sensor, fluorescence imaging and a light source synchronization type sensor in which a background light removal performance is increased. In particular, this can be used in the field such as a human body recognition in home electric appliances, an observation of a pose of a sport player, eyes of a robot, and a collision avoidance of a car.

The invention claimed is:

1. A high-speed charge-transfer photodiode connected to a charge-collection region having a constant depletion potential, comprising:
   a first conductivity type semiconductor layer serving as a charge-generation region; and
   a second conductivity type surface-buried region being continuous to the first conductivity type semiconductor layer as a same semiconductor layer, selectively buried in a part of an upper portion of the semiconductor layer, serving as a charge-transfer region of charges generated by the charge-generation region,
   wherein a specified direction directed toward the charge-collection region, in the surface-buried region provided along a plane parallel to a surface of the semiconductor layer, is assigned as a charge-transfer direction of the charges, and
   at least one of a variation of widths of the surface-buried region defined in an orthogonal direction to the charge-transfer direction and a variation of impurity concentration distributions of the surface-buried region, which are measured along the charge-transfer direction, is determined such that an electric field distribution in the charge-transfer direction is constant in the entire region of the charge-transfer region.

2. The high-speed charge-transfer photodiode of claim 1, wherein the variation of the widths of the surface-buried region is so determined that a first derivative of a function of the variation of the widths of the surface-buried region, with respect to a distance along the charge-transfer direction, is constant, wherein a depletion potential in the surface-buried region is represented by the function.

3. The high-speed charge-transfer photodiode of claim 1, wherein the impurity concentrations of the surface-buried region is so determined that a first derivative of a function of the variation of the impurity concentrations of the surface-buried region, with respect to a distance along the charge-transfer direction, is constant, wherein a depletion potential in the surface-buried region is represented by the function.

4. A lock-in pixel comprising:
   a high-speed charge-transfer photodiode configured to receive a pulsed light reflected by a target sample as an optical signal, to convert the optical signal into signal charges in a charge-generation region, and to inject the signal charges into a charge-transfer region;
   a charge-collection region having a constant depletion potential, connected to the charge-transfer region, implemented by a same semiconductor region as the charge-transfer region;
   first and second transfer gate electrodes configured to electro-statically control potentials of first and second transfer channels, being continuous to the charge-collection region and implemented by a same semiconductor region as the charge-generation region, through an insulation film formed on the first and second transfer channels, respectively, and to collect the signal charges generated by the charge-generation region into the charge-collection region, and to alternately transfer the signal charges through the first and second transfer channels; and
   first and second floating-diffusion regions configured to sequentially accumulate the signal charges transferred by the first and second transfer gate electrodes, respectively,
   wherein the high-speed charge-transfer photodiode comprises:
      a first conductivity type semiconductor layer serving as the charge-generation region; and
      a second conductivity type surface-buried region selectively buried in a part of an upper portion of the semiconductor layer, serving as the charge-transfer region configured to transfer the signal charges,
   wherein a specified direction directed toward the charge-collection region, in the surface-buried region provided along a plane parallel to a surface of the semiconductor layer is assigned as a charge-transfer direction of the charges,
   at least one of a variation of widths of the surface-buried region defined in an orthogonal direction to the charge-transfer direction and a variation of impurity concentration distributions of the surface-buried region, which are measured along the charge-transfer direction, is determined such that an electric field distribution in the charge-transfer direction is constant in the entire region of the charge-transfer region, and
   synchronously with the pulsed light, by applying a control-pulse signal sequentially to the first and second transfer gate electrodes so as to operate the first and second transfer gate electrodes, a distance from the target sample is measured, on the basis of an allocation ratio of the charges accumulated in the first and second floating-diffusion regions.

5. The lock-in pixel of claim 4, further comprising:
an exhausting gate electrode configured to electro-statically control a potential of an exhausting channel implemented by a same semiconductor region as the charge-collection region through the insulation film formed on the exhausting channel, to collect background-light charges generated by the charge-generation region, when background light is received, into the charge-collection region, and to extract the background-light charges; and
an exhausting drain region configured to receive the background-light charges extracted by the exhausting gate electrode,
wherein, synchronously with the pulsed light, by applying a control-pulse signal sequentially to the first and second transfer gate electrodes so as to operate the first and second transfer gate electrodes, a distance from the target sample is measured, on the basis of an allocation ratio of the charges accumulated in the first and second floating-diffusion regions.

6. The lock-in pixel of claim 5, wherein a time interval of the control-pulse signal applied to the exhausting gate electrode is longer than time intervals of the control-pulse signals applied to the first and second transfer gate electrodes.

7. A solid-state imaging device, comprising a plurality of lock-in pixels arrayed in a one-dimensional direction, each of the lock-in pixels comprises:
a high-speed charge-transfer photodiode configured to receive a pulsed light reflected by a target sample as an optical signal, to convert into signal charges in a charge-generation region, and to inject the signal charges into a charge-transfer region;
a charge-collection region having a constant depletion potential, connected to the charge-transfer region, implemented by a same semiconductor region as the charge-transfer region;
first and second transfer gate electrodes configured to electro-statically control potentials of first and second transfer channels, being continuous to the charge-collection region and implemented by a same semiconductor region as the charge-generation region, through an insulation film formed on the first and second transfer channels, respectively, to collect the signal charges generated by the charge-generation region into the charge-collection region, and to alternately transfer the signal charges through the first and second transfer channels; and
first and second floating-diffusion regions configured to sequentially accumulate the signal charges transferred by the first and second transfer gate electrodes, respectively,
wherein the high-speed charge-transfer photodiode comprises:
a first conductivity type semiconductor layer serving as the charge-generation region; and
a second conductivity type surface-buried region selectively buried in a part of an upper portion of the semiconductor layer, serving as the charge-transfer region configured to transfer the signal charges,
wherein a specified direction directed toward the charge-collection region, in the surface-buried region provided along a plane parallel to a surface of the semiconductor layer, is assigned as a charge-transfer direction of the charges,
at least one of a variation of widths of the surface-buried region defined in an orthogonal direction to the charge-transfer direction and a variation of impurity concentration distributions of the surface-buried region, which are measured along the charge-transfer direction, is determined such that an electric field distribution in the charge-transfer direction is constant in the entire region of the charge-transfer region,
synchronously with the pulsed light, by applying a control-pulse signal sequentially to the first and second transfer gate electrodes of all of the lock-in pixels, in each of the lock-in pixels, a distance from the target sample is measured on the basis of an allocation ratio of the charges accumulated in the first and second floating-diffusion regions.

8. The solid-state imaging device of claim 7, wherein each of the lock-in pixels further comprises:
an exhausting gate electrode configured to electro-statically control a potential of an exhausting channel implemented by a same semiconductor region as the charge-collection region through the insulation film formed on the exhausting channel, to collect background-light charges generated by the charge-generation region, when background light is received into the charge-collection region, and to extract the background-light charges; and
an exhausting drain region configured to receive the background-light charges extracted by the exhausting gate electrode,
wherein, synchronously with the pulsed light, by applying the control-pulse signal sequentially to the first and second transfer gate electrodes and the exhausting gate electrode so as to operate the first and second transfer gate electrodes, the distance from the target sample is measured, on the basis of the allocation ratio of the charges accumulated in the first and second floating-diffusion regions.

9. The solid-state imaging device of claim 8, wherein the optical signal includes an excitation light pulse reflected by the target sample and a fluorescence light generated from the target sample when the excitation light pulse is received by the target sample, and
in a certain period after falling of the excitation light pulse, the signal charges are selectively transferred from the surface-buried region to the first and second floating-diffusion regions, and
when the excitation light is emitted, the charges are extracted from the surface-buried region to the exhausting drain region.

10. The solid-state imaging device of claim 8, wherein the optical signal includes an excitation light pulse reflected by the target sample and a fluorescence light generated from the target sample when the excitation light pulse is received by the target sample, and
in a first period after falling of the excitation light pulse, a part of the signal charges is transferred from the surface-buried region to the first and second floating-diffusion regions, and the signal charges accumulated in the first and second floating-diffusion regions are read out as a first accumulation charge amounts, and
in a second period after the first period, the other part of the signal charges is transferred from the surface-buried region to the first and second floating-diffusion regions, and the signal charges accumulated in the first and second floating-diffusion regions are read out as a second accumulation charge amount, and
a life time of the fluorescence light is measured on the basis of a ratio of the first and second accumulation charge amounts.

11. The solid-state imaging device of claim 8, wherein a time interval of the control-pulse signal applied to the exhausting gate electrode is longer than time intervals of the control-pulse signals applied to the first and second transfer gate electrodes.

12. The solid-state imaging device of claim 7, wherein a time interval of the control-pulse signal applied to the exhausting gate electrode is longer than time intervals of the control-pulse signals applied to the first and second transfer gate electrodes.

13. A solid-state imaging device, comprising a plurality of lock-in pixels arrayed in a shape of a two-dimensional matrix, each of the lock-in pixels comprises:
 a high-speed charge-transfer photodiode configured to receive a pulsed light reflected by a target sample as an optical signal, to convert into signal charges in a charge-generation region, and to inject the signal charges into a charge-transfer region;
 a charge-collection region having a constant depletion potential, connected to the charge-transfer region, implemented by a same semiconductor region as the charge-transfer region;
 first and second transfer gate electrodes configured to electro-statically control potentials of first and second transfer channels, being continuous to the charge-collection region and implemented by a same semiconductor region as the charge-generation region, through an insulation film formed on the first and second transfer channels, respectively, to collect the signal charges generated by the charge-generation region into the charge-collection region, and to alternately transfer the signal charges through the first and second transfer channels; and
 first and second floating-diffusion regions configured to sequentially accumulate the signal charges transferred by the first and second transfer gate electrodes, respectively,
 wherein the high-speed charge-transfer photodiode comprises:
  a first conductivity type semiconductor layer serving as the charge-generation region; and
  a second conductivity type surface-buried region selectively buried in a part of an upper portion of the semiconductor layer, serving as the charge-transfer region configured to transfer the signal charges,
 wherein a specified direction directed toward the charge-collection region, in the surface-buried region provided along a plane parallel to a surface of the semiconductor layer, is assigned as a charge-transfer direction of the charges,
 at least one of a variation of widths of the surface-buried region defined in an orthogonal direction to the charge-transfer direction and a variation of impurity concentration distributions of the surface-buried region, which are measured along the charge-transfer direction, is determined such that an electric field distribution in the charge-transfer direction is constant in the entire region of the charge-transfer region,
 synchronously with the pulsed light, by applying a control-pulse signal sequentially to the first and second transfer gate electrodes of all of the lock-in pixels, in each of the lock-in pixels, a distance from the target sample is measured on the basis of an allocation ratio of the charges accumulated in the first and second floating-diffusion regions, and
 all of the lock-in pixels are two-dimensionally accessed to get a two-dimensional picture corresponding to the measured distances.

14. The solid-state imaging device of claim 13, wherein each of the lock-in pixels further comprises:
 an exhausting gate electrode configured to electro-statically control a potential of an exhausting channel implemented by a same semiconductor region as the charge-collection region through the insulation film formed on the exhausting channel, to collect background-light charges generated by the charge-generation region when background light is received into the charge-collection region, and to extract background-light charges; and
 an exhausting drain region configured to receive the background-light charges extracted by the exhausting gate electrode,
 wherein, synchronously with the pulsed light, by applying a control-pulse signal sequentially to the first and second transfer gate electrodes and the exhausting gate electrodes of all of the lock-in pixels, in each of the lock-in pixels, a distance from the target sample is measured on the basis of an allocation ratio of the charges accumulated in the first and second floating-diffusion regions, and
 all of the lock-in pixels are two-dimensionally accessed to get a two-dimensional picture corresponding to the measured distances.

15. The solid-state imaging device of claim 14, wherein a time interval of the control-pulse signal applied to the exhausting gate electrode is longer than time intervals of the control-pulse signals applied to the first and second transfer gate electrodes.

16. The solid-state imaging device of claim 14, wherein the optical signal includes an excitation light pulse reflected by the target sample and a fluorescence light generated from the target sample when the excitation light pulse is received by the target sample, and
 in a certain period after falling of the excitation light pulse, the signal charges are selectively transferred from the surface-buried region to the first and second floating-diffusion regions, and
 when the excitation light is emitted, the charges are extracted from the surface-buried region to the exhausting drain region.

17. The solid-state imaging device of claim 14, wherein the optical signal includes an excitation light pulse reflected by the target sample and a fluorescence light generated from the target sample when the excitation light pulse is received by the target sample, and
 in a first period after falling of the excitation light pulse, a part of the signal charges is transferred from the surface-buried region to the first and second floating-diffusion regions, and the signal charges accumulated in the first and second floating-diffusion regions are read out as a first accumulation charge amounts, and
 in a second period after the first period, the other part of the signal charges is transferred from the surface-buried region to the first and second floating-diffusion regions, and the signal charges accumulated in the first and second floating-diffusion regions are read out as a second accumulation charge amount, and
 a life time of the fluorescence light is measured on the basis of a ratio of the first and second accumulation charge amounts.

18. The solid-state imaging device of claim 13, wherein a time interval of the control-pulse signal applied to the exhausting gate electrode is longer than time intervals of the control-pulse signals applied to the first and second transfer gate electrodes.

* * * * *